(12) United States Patent
Aggarwal et al.

(10) Patent No.: US 12,405,434 B2
(45) Date of Patent: Sep. 2, 2025

(54) EMBEDDING A PHOTONIC INTEGRATED CIRCUIT IN A SEMICONDUCTOR PACKAGE FOR HIGH BANDWIDTH MEMORY AND COMPUTE

(71) Applicant: Celestial AI Inc., Santa Clara, CA (US)

(72) Inventors: Ankur Aggarwal, Pleasanton, CA (US); Subal Sahni, Santa Clara, CA (US); Philip Winterbottom, San Jose, CA (US); Martinus Bos, San Jose, CA (US)

(73) Assignee: Celestial AI Inc., Santa Clara, CA (US)

( * ) Notice: Subject to any disclaimer, the term of this patent is extended or adjusted under 35 U.S.C. 154(b) by 0 days.

(21) Appl. No.: 18/584,748

(22) Filed: Feb. 22, 2024

(65) Prior Publication Data

US 2025/0216632 A1 Jul. 3, 2025

Related U.S. Application Data

(63) Continuation of application No. 18/583,749, filed on Feb. 21, 2024.
(Continued)

(51) Int. Cl.
  *G02B 6/42* (2006.01)
  *G02B 6/12* (2006.01)
  (Continued)

(52) U.S. Cl.
  CPC ....... *G02B 6/4283* (2013.01); *G02B 6/12002* (2013.01); *G02B 6/124* (2013.01);
  (Continued)

(58) Field of Classification Search
  CPC .................................... G02B 6/42; G02B 6/43
  (Continued)

(56) References Cited

U.S. PATENT DOCUMENTS 6,690,845 B1 * 2/2004 Yoshimura ............. G02B 6/124
  257/E25.032
7,333,684 B2 * 2/2008 Shie ....................... H04B 10/40
  385/33

(Continued)

FOREIGN PATENT DOCUMENTS

CN      113960715        1/2022
CN      217467261 U *    9/2022
WO      WO 2023/174186   9/2023

OTHER PUBLICATIONS

International Search Report and Written Opinion in International Application No. PCT/US2024/062174, mailed on Mar. 21, 2025, 21 pages.

*Primary Examiner* — Kaveh C Kianni
(74) *Attorney, Agent, or Firm* — Fish & Richardson P.C.

(57) ABSTRACT

A package includes a photonic integrated circuit (PIC) disposed on a substrate and comprising a semiconductor die hosting an active portion and a passive portion mutually coupled, the active portion being configured to consume electrical power when activated, and the passive portion comprising an optical transmission medium configured to propagate an optical signal to or from the active portion of the PIC; an electronic integrated circuit (EIC) electrically coupled to the active portion of the PIC and comprising components that electrically operate on the active portion of the PIC; and a packaging compound at least partially encapsulating the PIC, the packaging compound defining a cavity on a side of the semiconductor die that is opposite from the substrate, the cavity being filled with an optically transparent medium such that the optical signal can be received from or transmitted to the passive portion of the PIC through the cavity.

5 Claims, 33 Drawing Sheets

Related U.S. Application Data

(60) Provisional application No. 63/616,465, filed on Dec. 29, 2023.

(51) Int. Cl.

| | | |
|---|---|---|
| *G02B 6/124* | (2006.01) | |
| *G02B 6/13* | (2006.01) | |
| *G02B 6/43* | (2006.01) | |
| *H01L 21/56* | (2006.01) | |
| *H01L 25/16* | (2023.01) | |
| *H10B 80/00* | (2023.01) | |

(52) U.S. Cl.
CPC ............... *G02B 6/13* (2013.01); *G02B 6/42* (2013.01); *G02B 6/4213* (2013.01); *G02B 6/4214* (2013.01); *G02B 6/4226* (2013.01); *G02B 6/4239* (2013.01); *G02B 6/4259* (2013.01); *G02B 6/428* (2013.01); *G02B 6/4293* (2013.01); *G02B 6/43* (2013.01); *H01L 21/56* (2013.01); *H01L 25/167* (2013.01); *G02B 2006/12107* (2013.01); *H10B 80/00* (2023.02)

(58) Field of Classification Search
USPC .......................................................... 385/14
See application file for complete search history.

(56) References Cited

U.S. PATENT DOCUMENTS

| | | | | |
|---|---|---|---|---|
| 9,209,142 | B1* | 12/2015 | Lambert | H01L 21/6835 |
| 9,488,791 | B2* | 11/2016 | Chang | G02B 6/4214 |
| 9,557,478 | B2* | 1/2017 | Doerr | G02B 6/428 |
| 9,606,308 | B2* | 3/2017 | Barwicz | G02B 6/4232 |
| 9,874,688 | B2* | 1/2018 | Doerr | G02B 6/4269 |
| 10,103,510 | B2* | 10/2018 | Kainuma | G02B 6/4232 |
| 10,222,555 | B2* | 3/2019 | Numata | G02B 6/425 |
| 10,326,423 | B1* | 6/2019 | Bartell | H03F 1/56 |
| 10,678,073 | B2* | 6/2020 | Krasulick | G02F 1/0121 |
| 10,712,499 | B2* | 7/2020 | Bulumulla | H01L 24/17 |
| 11,163,120 | B2* | 11/2021 | Ardalan | G02B 6/4232 |
| 11,804,452 | B2* | 10/2023 | Polomoff | G02B 6/13 |
| 2013/0107901 | A1* | 5/2013 | Deppe | B82Y 20/00 |
| | | | | 438/45 |
| 2013/0314707 | A1* | 11/2013 | Shastri | G01B 11/14 |
| | | | | 356/399 |
| 2015/0076661 | A1* | 3/2015 | Musk | H01L 23/4985 |
| | | | | 257/615 |
| 2015/0098676 | A1* | 4/2015 | Krasulick | G02B 6/12004 |
| | | | | 438/27 |
| 2015/0099318 | A1* | 4/2015 | Krasulick | H01S 5/02325 |
| | | | | 438/27 |
| 2016/0274319 | A1* | 9/2016 | Krasulick | G02B 6/12004 |
| 2017/0194310 | A1* | 7/2017 | Evans | H01L 24/09 |
| 2018/0309051 | A1* | 10/2018 | Deshpande | H01L 21/768 |
| 2020/0158959 | A1* | 5/2020 | Ardalan | H01L 21/565 |
| 2021/0104812 | A1 | 4/2021 | Kapusta et al. | |
| 2022/0365295 | A1* | 11/2022 | Jiang | H01L 24/17 |
| 2023/0087809 | A1* | 3/2023 | Li | G02B 6/32 |
| | | | | 385/33 |
| 2023/0088009 | A1* | 3/2023 | Karhade | G02B 6/4243 |
| | | | | 385/14 |
| 2023/0089433 | A1* | 3/2023 | Li | G02B 6/4214 |
| | | | | 385/49 |
| 2023/0089494 | A1* | 3/2023 | Li | G02B 6/428 |
| | | | | 385/14 |
| 2023/0089877 | A1* | 3/2023 | Karhade | G02B 6/4239 |
| | | | | 385/33 |
| 2023/0092821 | A1* | 3/2023 | Karhade | G02B 6/3897 |
| | | | | 385/14 |
| 2023/0350142 | A1* | 11/2023 | Yu | G02B 6/4243 |
| 2024/0337799 | A1 | 10/2024 | Ravichandran et al. | |

* cited by examiner

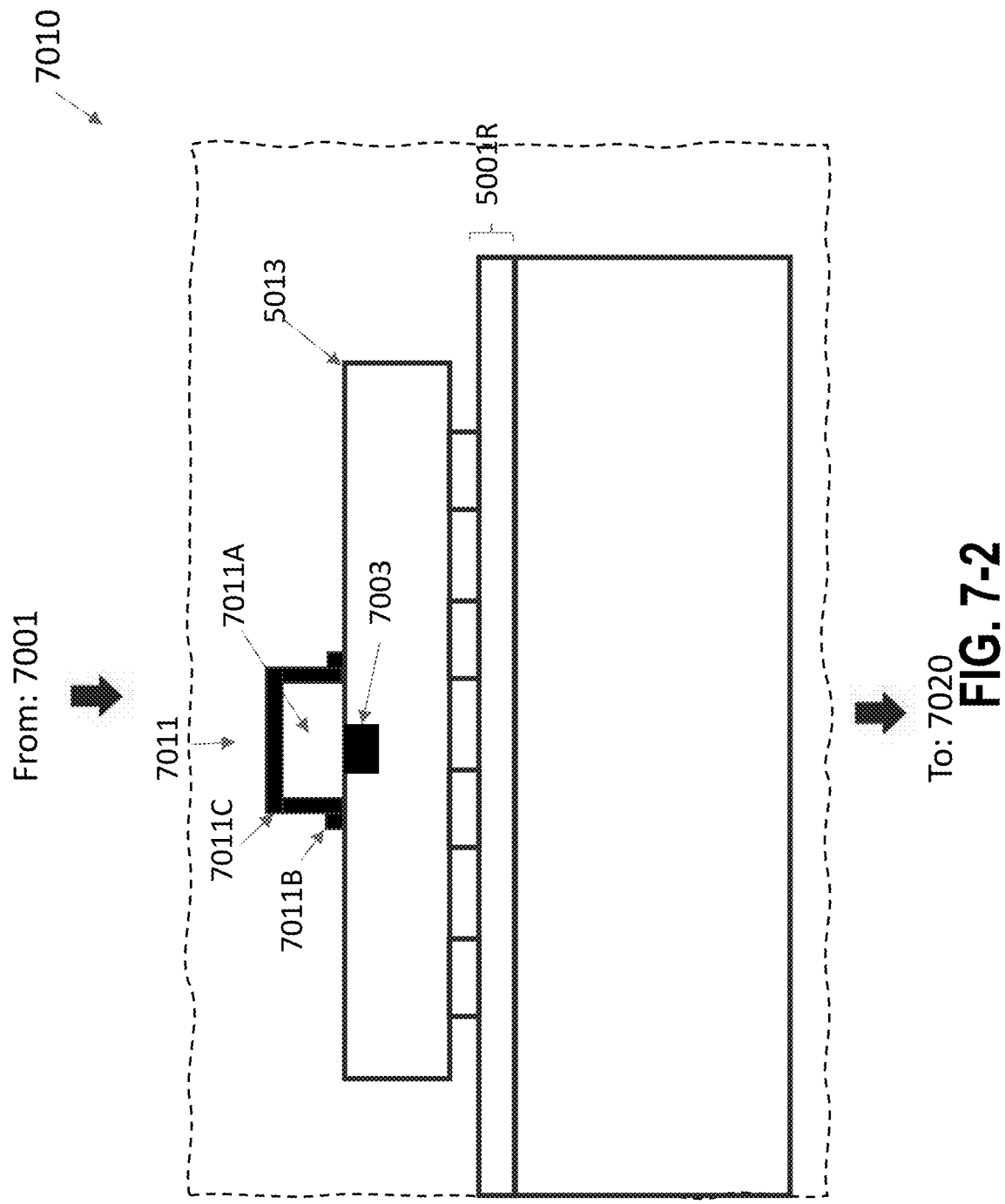

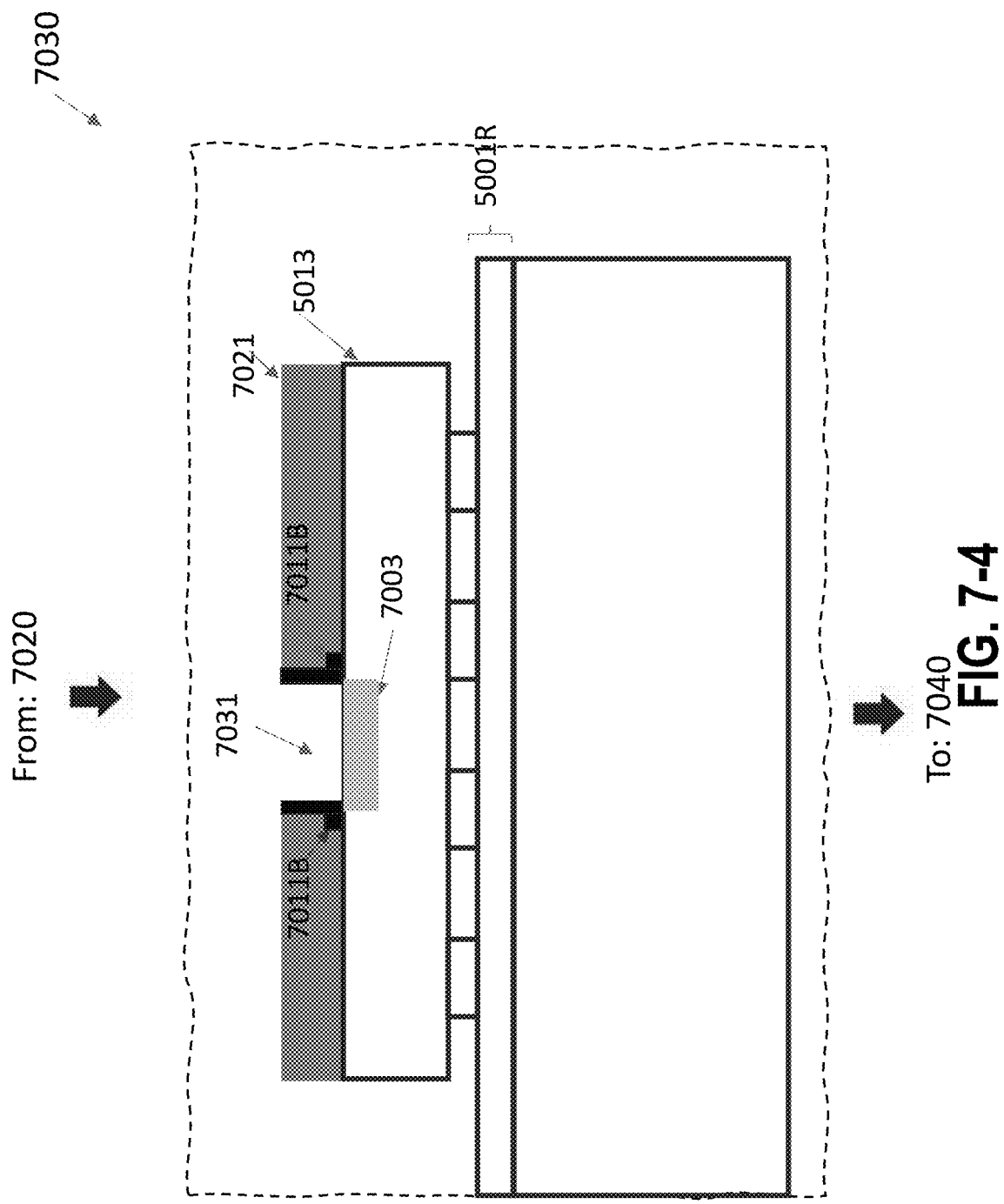

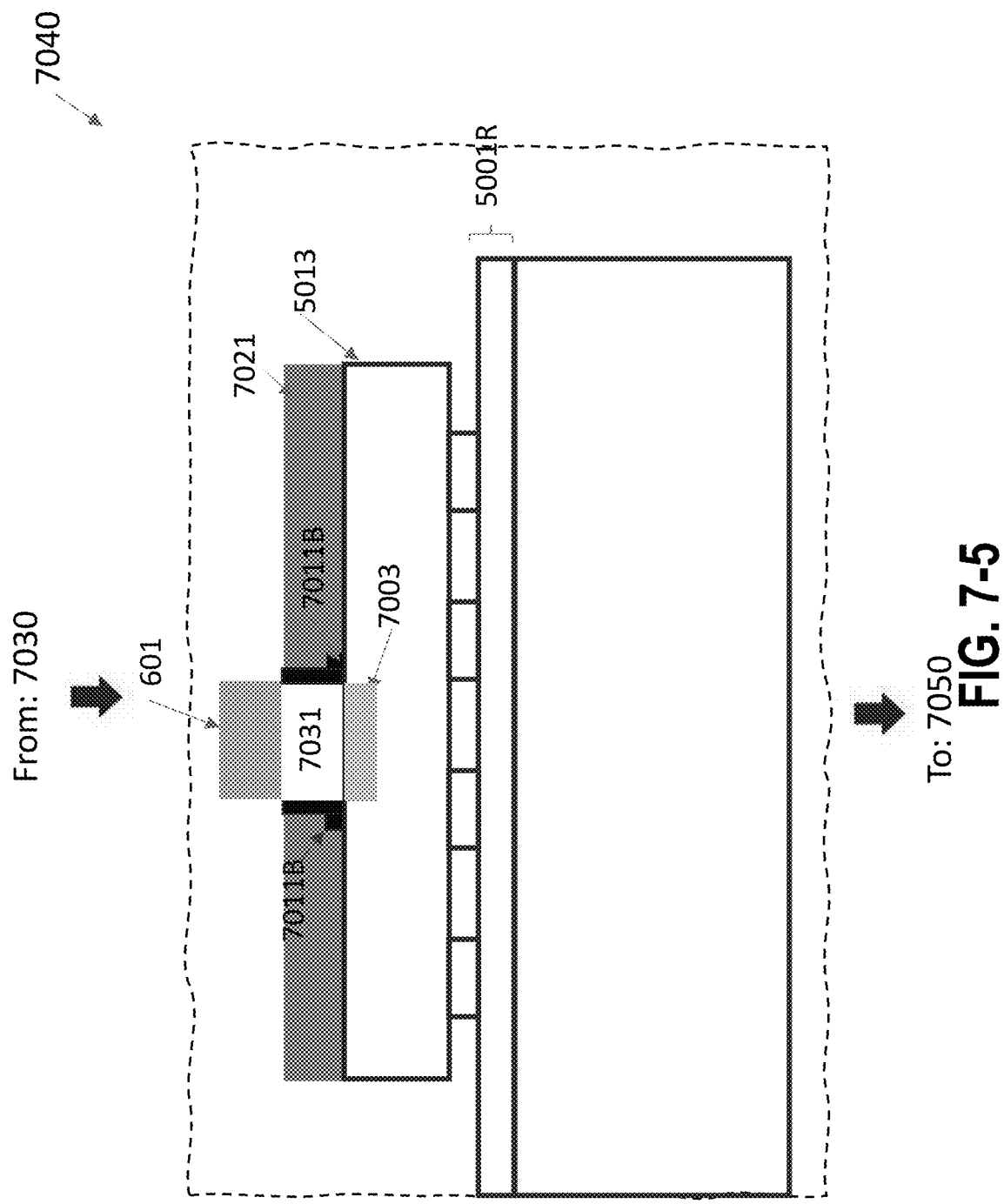

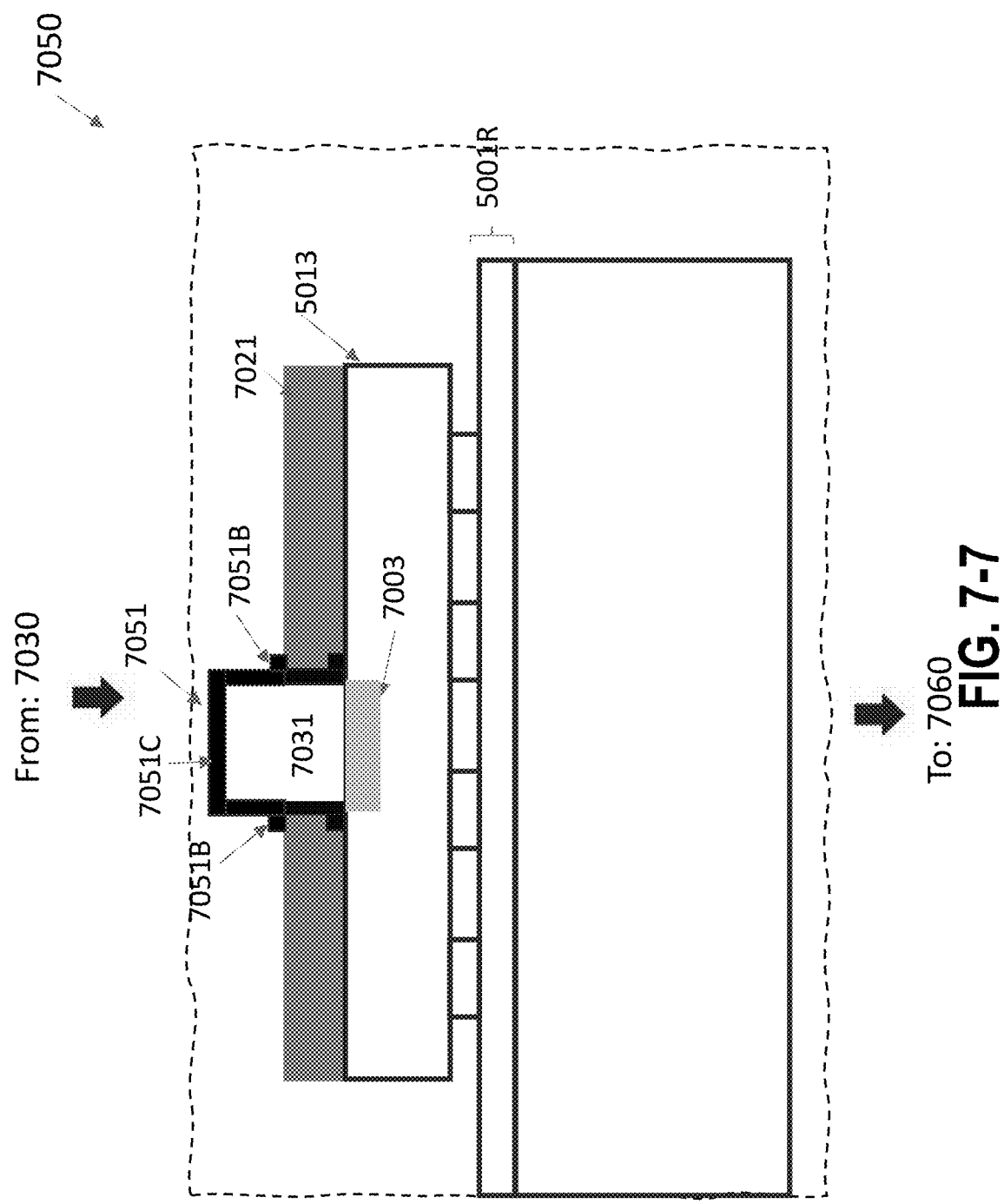

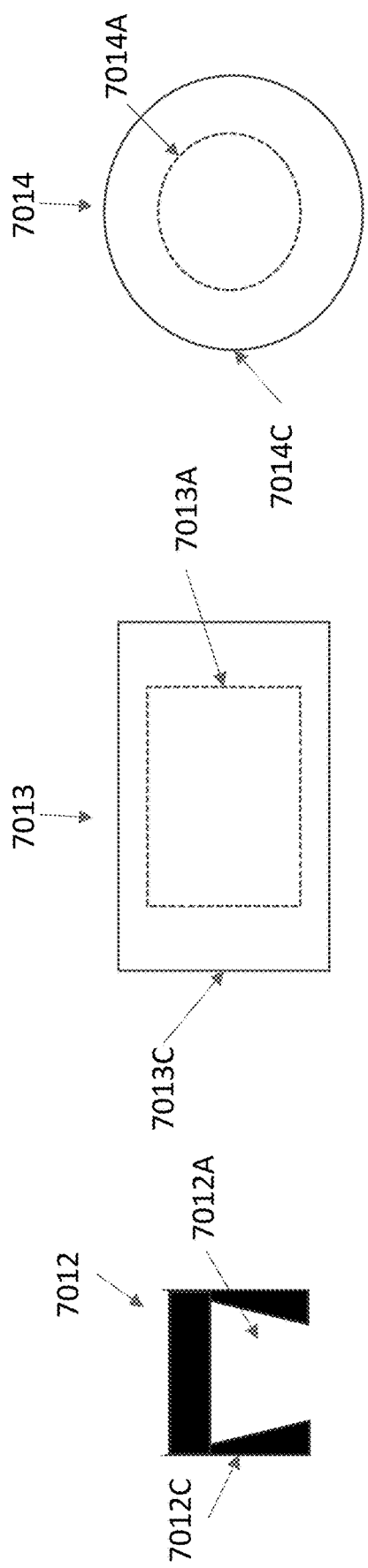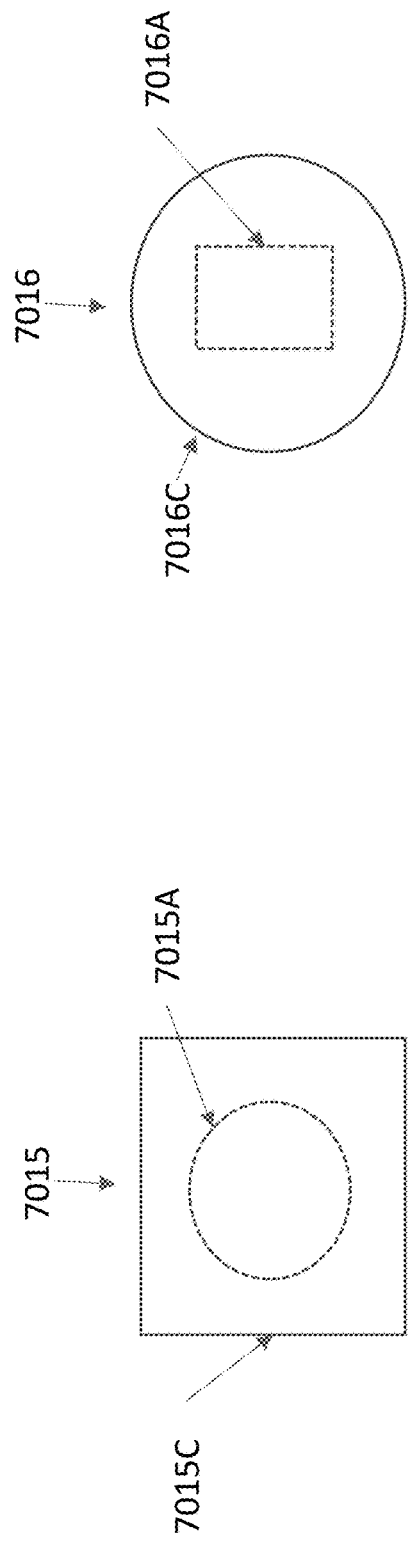

EMBEDDING A PHOTONIC INTEGRATED CIRCUIT IN A SEMICONDUCTOR PACKAGE FOR HIGH BANDWIDTH MEMORY AND COMPUTE

CROSS-REFERENCE TO RELATED APPLICATION

This application is a continuation application claiming the benefit under 35 U.S.C. § 120 of U.S. patent application Ser. No. 18/583,749, titled "Embedding a Photonic Integrated Circuit in a Semiconductor Package for High Bandwidth Memory and Compute," filed Feb. 21, 2024, which claims the benefit of U.S. Provisional Patent Application No. 63/616,465, titled "Photonic Interconnect Platform for Memory and Compute," filed Dec. 29, 2023, and the contents of both are incorporated herein by reference.

BACKGROUND

Demands for artificial intelligence (AI) computing, such as machine learning (ML) and deep learning (DL), are increasing faster than they can be met by increases in available processing capacity. This rising demand and the growing complexity of AI models drive the need to connect many chips into a system where the chips can send data between each other with low latency and at high speed. Performance when processing a workload is limited by memory and interconnect bandwidth. In many conventional systems, data movement leads to significant power consumption, poor performance, and excessive latency. Thus, multi-node computing systems that can process and transmit data between nodes quickly and efficiently may be advantageous for the implementation of (ML) models.

SUMMARY

This specification describes a package that includes: a photonic integrated circuit (PIC) disposed on a substrate and that includes a semiconductor die hosting an active portion and a passive portion mutually coupled, the active portion being configured to consume electrical power when activated, and the passive portion comprising an optical transmission medium configured to allow an optical signal to propagate to or from the active portion of the PIC; an electronic integrated circuit (EIC) electrically coupled to the active portion of the PIC and comprising components that electrically operate on the active portion of the PIC; and a packaging compound at least partially encapsulating the PIC, the packaging compound defining a cavity on a side of the semiconductor die that is opposite from the substrate, the cavity being filled with a transparent (i.e., optically transparent) medium such that the optical signal can be received from or transmitted to the passive portion of the PIC through the cavity.

This specification also describes a method for embedding a photonic integrated circuit (PIC) in a package comprising the PIC and at least one electronic integrated circuit (EIC), the PIC comprising an active portion which consumes electrical power when the PIC is activated and a passive portion comprising an optical transmission medium configured to allow an optical signal to propagate to or from the active portion, the method including: masking a portion of a surface of the PIC with a masking material, the portion corresponding to one or more photonic ports in the passive portion of the PIC; depositing a layer of a molding material to at least partially encase the PIC including the masking material; and removing a portion of the layer of the molding material sufficient to expose the masking material.

This specification also describes a method for embedding a photonic integrated circuit (PIC) in a package comprising the PIC and at least one electronic integrated circuit (EIC), the PIC comprising an active portion which consumes electrical power when the PIC is activated and a passive portion comprising an optical transmission medium configured to allow an optical signal to propagate to or from the active portion, the method comprising: depositing a first layer of a curable material on a portion of a surface of the PIC, the portion of the surface corresponding to one or more photonic ports in the passive portion of the PIC; curing the curable material to provide a layer of a solid and transparent material adjacent to the portion of the surface of the PIC; depositing a layer of molding material to at least partially encase the PIC including the layer of solid and transparent material; and removing a portion of the layer of molding material sufficient to expose the solid and transparent material.

Additional features and advantages will be set forth in the description that follows. Features and advantages of the technology described in this specification may be realized and obtained by means of the systems and methods that are particularly pointed out in the appended claims. Such features will become more fully apparent from the following description and appended claims, or may be learned by the practice of the disclosed subject matter as set forth hereinafter.

BRIEF DESCRIPTION OF THE DRAWINGS

In order to describe the manner in which the above-recited and other features of this specification can be obtained, a more particular description will be rendered by reference to specific examples thereof which are illustrated in the appended drawings. For better understanding, the like elements have been designated by like reference numbers throughout the various accompanying figures. Understanding that the drawings depict some example examples, the examples will be described and explained with additional specificity and detail through the use of the accompanying drawings in which:

FIG. 1-2 is a block diagram illustrating various components of the example of the computing node of FIG. 1-1;

FIG. 1-3 is a block diagram illustrating various components of the example computing node of FIG. 1-1;

FIG. 1-4 is a diagram illustrating a side view of an example structural implementation of the circuit package of FIG. 1-1;

FIG. 2-1 illustrates an example of a circuit package implementing an intra-chip bidirectional photonic channel between a first compute node and a second compute node;

FIG. 2-2 illustrates an example circuit package implementing an inter-chip bidirectional photonic channel between a compute node and an additional compute node located on an additional circuit package;

FIG. 3-1 is a diagram illustrating an example of a circuit package implementing multiple compute nodes;

FIG. 3-2 is a diagram illustrating an example of the circuit package of FIG. 3-1;

FIG. 3-3 is a diagram illustrating an example of the circuit package of FIG. 3-1;

FIG. 3-4 is a diagram illustrating an example of the circuit package of FIG. 3-1;

FIG. 3-5 is a diagram illustrating an example of the circuit package of FIG. 3-1;

FIG. 4 is a diagram illustrating an example implementation of four of the circuit packages of FIG. 2-1 being interconnected;

FIG. 5-1 illustrates a step during an example process for packaging a combined EIC-PIC stack;

FIG. 5-2 illustrates another step during the example process of FIG. 5-1;

FIG. 5-3 illustrates yet another step during the example process of FIG. 5-1;

FIG. 5-4 illustrates still another step during the example process of FIG. 5-1;

FIG. 5-5 illustrates an additional step during the example process of FIG. 5-1;

FIG. 5-6 illustrates one more step during the example process of FIG. 5-1;

FIG. 6 illustrates an example of a combined EIC-PIC stack;

FIG. 7-1 illustrates a step during another example process for packaging a combined EIC-PIC stack;

FIG. 7-2 illustrates another step during the example process of FIG. 7-1;

FIG. 7-3 illustrates yet another step during the example process of FIG. 7-1;

FIG. 7-4 illustrates still another step during the example process of FIG. 7-1;

FIG. 7-5 illustrates yet still another step during the example process of FIG. 7-1;

FIG. 7-6 illustrates an additional step during the example process of FIG. 7-1;

FIG. 7-7 illustrates yet an additional step during the example process of FIG. 7-1;

FIG. 7-8 illustrates still an additional step during the example process of FIG. 7-1;

FIG. 7-9 illustrates yet still an additional step during the example process of FIG. 7-1;

FIG. 7-10 illustrates one more step during the example process of FIG. 7-1;

FIG. 7-11 illustrates still one more step during the example process of FIG. 7-1;

FIG. 7-12 illustrates, in a cross-sectional profile, another example of a cap that can be used in the example processes shown in FIGS. 7-1 through 7-11;

FIG. 7-13 illustrates a top view of an example of a cap that can be used in the example processes shown in FIGS. 7-1 through 7-11;

FIG. 7-14 illustrates a top view of another example of a cap that can be used in the example processes shown in FIGS. 7-1 through 7-11;

FIG. 7-15 illustrates a top view of another example of a cap that can be used in the example processes shown in FIGS. 7-1 through 7-11;

FIG. 7-16 illustrates a top view of another example of a cap that can be used in the example processes shown in FIGS. 7-1 through 7-11;

FIG. 8 illustrates another example of a circuit package implementing an inter-chip bidirectional photonic channel between a compute node and an additional compute node located on an additional circuit package; and FIG. 9 illustrates certain components that can be included within a computer system.

DETAILED DESCRIPTION

Figure 1:
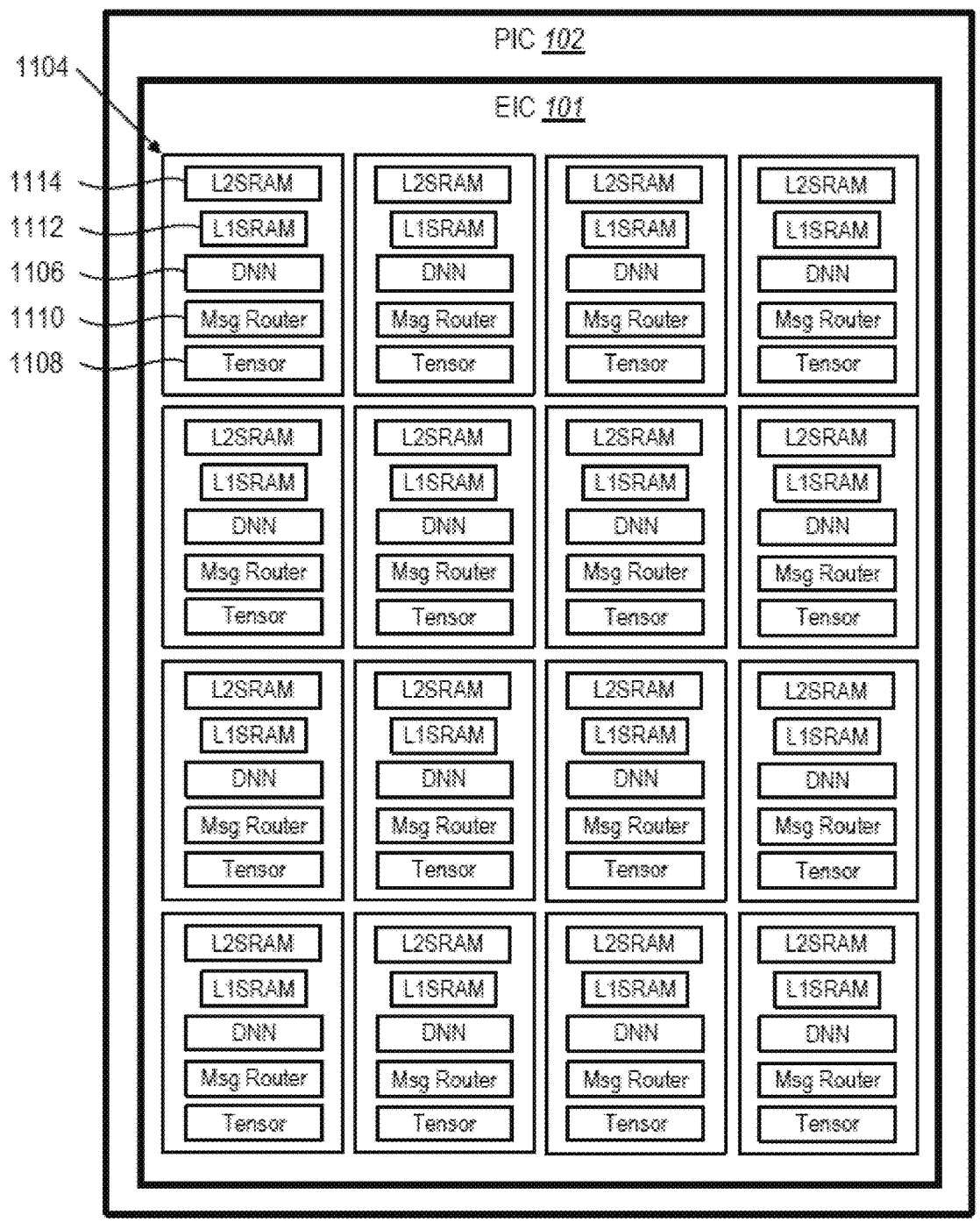
FIG. 1-1 is a diagram schematically illustrating components of an example system-in-package (SIP)

This specification describes computing systems, implemented by one or more circuit packages, e.g., SIPs, that achieve reduced power consumption and/or increased processing speed. In accordance with various examples, power consumed for, in particular, data movement is reduced by increasing data locality in each circuit package and reducing energy losses when data movement is needed compared to conventional computer systems. Power-efficient data movement, in turn, can be accomplished by moving data over small distances in the electronic domain, while leveraging photonic channels for data movement in scenarios where the resistance in the electronic domain and/or the speed at which the data can move in the electronic domain leads to bandwidth limitations that cannot be overcome using existing electronic technology. Thus, in some examples, each circuit package includes an electronic integrated circuit (EIC) comprising multiple circuit blocks, hereinafter "processing elements" or "compute nodes", that are connected by bidirectional photonic channels, e.g., implemented in a PIC in a separate layer or chip of the package, into a hybrid, electronic-photonic, also called electro-photonic, network-on-chip (NoC). Multiple such NoCs may be connected, by inter-chip bidirectional photonic channels, e.g., implemented by optical fiber, between respective circuit packages into a larger electro-photonic network, to scale the computing system to arbitrary size without incurring significant power or speed losses.

While the described computing systems and its various novel aspects are generally applicable to a wide range of processing tasks, they are particularly suited to implementing ML models, in particular artificial neural networks (ANNs). As applied to ANNs, a circuit package and system of interconnected circuit packages as described herein are also referred to as an "ML processor" and "ML accelerator," respectively. Neural networks generally include one or more layers of artificial neurons that compute neuron output activations from weighted sums, corresponding to multiply-accumulate (MAC) operations, of a set of input activations. For a given neural network, the flow of activations between nodes and layers is fixed. Further, once training of the neural network is complete, the neuron weights in the weighted summation, and any other parameters associated with computing the activations, are likewise fixed. Thus, a NoC as described herein lends itself to implementing a neural network by assigning neural nodes to compute nodes, preloading the fixed weights associated with the nodes into memory of the respective compute nodes, and configuring data routing between the compute nodes based on the predetermined flow of activations. The weighted summation can be efficiently performed using a dot product engine, herein also called a "digital neural network (DNN)" due to its applicability to ANNs.

The foregoing high-level summary of various beneficial aspect and features of the described computing systems and underlying concepts will become clearer from the following description of example examples.

FIG. 1 is a diagram schematically illustrating components of an example circuit package 100, e.g., a SIP. The circuit package 100 may serve, for example, as an ML processor. The circuit package 100 includes an electronic integrated circuit 101 (EIC), for example, a digital and mixed-signal application-specific integrated circuit (ASIC), and a photonic integrated circuit 102 (PIC). The EIC 101 and PIC 102 are formed in different layers of the circuit package 100 which may be referred to as the "electronic circuit layer" and "photonic circuit layer," respectively, one stacked above the other, for example, using copper pillars, bump attachments, or other means to create an electrical interconnect to transmit and receive messages, packets, and/or data between the EIC and the PIC, as illustrated further below with reference to FIG. 1-4. The PIC or PICs 102 receive light from one or more laser light sources that may be integrated into the PIC 102 itself, or implemented separately from the PIC 102 either within or externally to the circuit package 100 and coupled into to the PIC 102 via suitable optical couplers. The optical couplers and laser sources are omitted from FIG. 1-1, but shown, for example, in FIG. 1-4. Generally, the laser sources and optical couplers are selected to provide optical signals within a band of wavelengths for which the PIC 102 and other optical components in the system is intended to operate. In some examples, the operational wavelengths are in a range from 1,500 nm to 1,600 nm, e.g., in the band of the spectrum referred to as the C-band and/or L-band.

The EIC 101 includes multiple compute nodes 1104. As will be discussed herein in detail, the compute nodes 1104 may communicate with each other via one or more intra-chip bidirectional channels. The intra-chip bidirectional channels may include one or more bidirectional photonic channels, e.g., implemented with optical waveguides in the PIC 102, and/or one or more electronic channels, e.g., implemented in the circuitry of the EIC 101. The compute nodes 1104 may be, although they need not in all examples, electronic circuits identical or at least substantially similar in design, and as shown, may form "tiles" of the same size arranged in an array, matrix, grid, or any other arrangement suitable for performing the techniques described herein.

In the present example, the EIC 101 has sixteen compute nodes 1104 arranged in a four-by-four array, but the number and arrangement of compute nodes can generally vary. More generally, neither the shape of the compute nodes nor the grid in which they are arranged need necessarily be rectangular; for example, oblique quadrilateral, triangular, or hexagonal shapes and grids, as well as topologies with three or more dimensions can also be used. Further, although tiling may provide for efficient use of the available on-chip real-estate, the compute nodes 104 need not be equally sized and regularly arranged in all examples. As shown in FIG. 1-1, in some examples, the compute nodes 104 are arranged in a rectilinear array, e.g., a conceptually square array.

Each compute node 1104 in the EIC 101 may include one or more circuit blocks serving as processing engines. For example, in the implementation shown in FIG. 1-1, each compute node 1104 includes a dot product engine, or DNN, 1106 and a tensor engine 1108. The DNN 1106 can perform rapid MAC operations at reduced energy per MAC to execute either a convolution function or a dot product function, e.g., as routinely used in neural networks. The tensor engine 108 may be used to perform other, non-MAC operations, e.g., implementing non-linear activation functions as applied to the weighted sums in a neural network. In other examples, the compute node 1104 can have any combination of processing elements such as CPUs, GPUs, TPUs, and the like, and the DNN 1106 and tensor engine 1108 can also be included or omitted depending on the application.

Each compute node 1104 includes a message router 1110. The message routers 1110 interface with channels, e.g., electronic and/or photonic channels as described below in reference to FIG. 1-2, to facilitate data flow to and from the compute nodes 1104. Further, the compute nodes 1104 each have a memory system, e.g., including level-one static random-access memory (L1SRAM) 1112 and level-two static random access memory (L2SRAM) 1114. L1SRAM 1112 is optional and, if included, can serve as scratchpad memory for each compute node 1104. L2SRAM 1114 may function as the primary memory for each compute nodes 1104 and may store certain fixed operands used by the DNN 1106 and tensor engine 1108, such as the weights of a machine learning model, in close physical proximity to the DNN 1106 and tensor engine 1108. L2SRAM 1114 may also store any intermediate results used in executing the machine learning model or other computation.

Figures 1, 2:
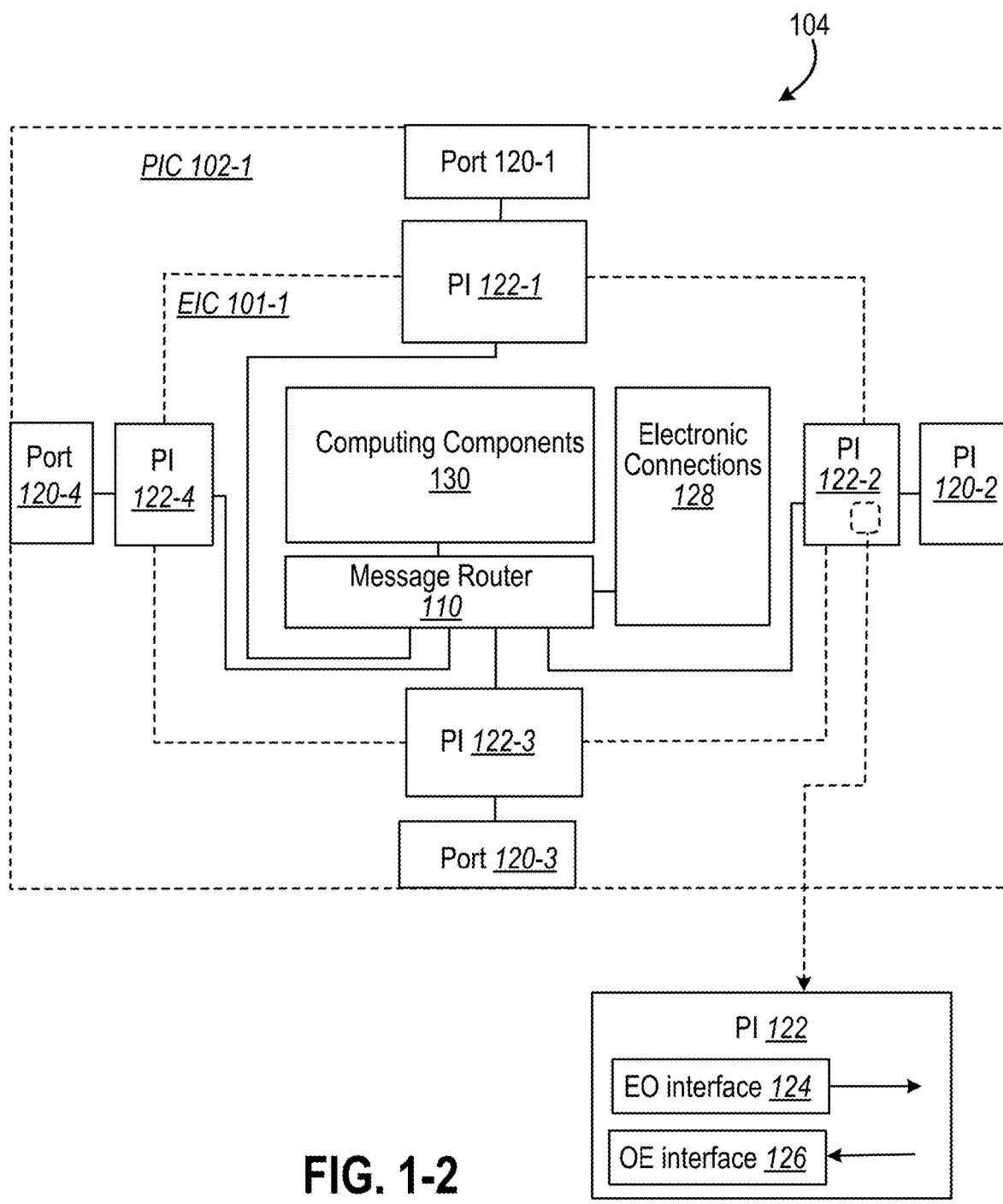

FIG. 1-2 is a block diagram illustrating various components of an example of the compute node 1104 of FIG. 1-1. Here, a compute node 104 includes various computing components 130, which may include the DNN 1106, the tensor engine 1108, interface controllers, routing controllers, the L1SRAM 1112 and/or the L2SRAM 1114 of FIG. 1-1, among other components. In some examples, the computing components 130 include memory components, e.g., a memory controller, vertically stacked high-bandwidth memory, etc., such that the compute node 104 may be a memory node as will be described herein. The computing components 130 are implemented on an EIC 101-1 of the compute node 104 and are in communication with the message router 110. For example, the message router 110 may receive messages from another computing component via one of optical ports or electronic connections 128, and additionally may send messages generated by the respective compute node 104 or the message router 110 via one of the optical ports or the electrical connects 128. The message router is implemented on the EIC 101-1 and may be implemented through hardware, software, or a combination of hardware and software. The message router is shown as a single block but can also include a message router associated with each photonic interface. The PIC 102 and EIC 101 as shown in FIG. 1-2 may be a portion of the PIC 102 and/or EIC 101 of FIG. 1-1, and may include various other computing componentry.

In some examples, the compute node 104 connects to one or more computing components through electronic channels, e.g., intra-chip electronic channels. For example, as will be discussed below in detail, the various compute nodes 104 in FIG. 1-1 may each connect to adjacent nodes via the electronic channels. The compute node 104 may connect to any other computing component through one or more electronic channels. In some examples, the compute node 104 is configured to connect to up to 4 adjacent compute nodes 104 through electronic channels. In some examples, the compute nodes 104 are configured to connect to additional componentry and/or nodes through electronic connections, such as other on-chip components, or can process data in the electrical domain within the compute node 104, using an electrical port (not shown) which is included in block 128. The electronic channels connected to the compute node 104 may each connect to the message router 110, represented by electronic connections 128. The electronic connections 128 may be implemented in the EIC 101 of the compute node 104. Messages or packets sent through the electronic connections 128 may therefore pass to and be acted on by the message router 110 to forward those messages on to additional computing components, or to pass the messages internally to the computing components 130 of the computing node 104. In this way, the computing node 104, and more specifically the message router 110, may be configured to connect to and communication with one or more computing components through the electronic connections 128.

In some examples, the compute node 104 is configured to connect to one or more optical connections or photonic channels. For example, as shown in FIG. 1-2, the compute node 104 includes four photonic ports 120-1, 120-2, 120-3, and 120-4, collectively, photonic ports 120. The four photonic ports 120-1 to 120-4 connect to four photonic channels. The photonic ports 120 facilitate connecting a photonic connection to the compute nodes 104. For example, the photonic ports 120 may include and/or may connect to one or more waveguides to direct an optical signal to and/or from the compute node 104. The photonic ports 120 are implemented in the PIC 102-1. In some examples, the photonic channels are bidirectional photonic channels to facilitate both sending and receiving communications through the photonic ports 120. For example, each bidirectional photonic channel may include two or more unidirectional links, e.g., one or more sending links and one or more receiving links. The unidirectional links may be associated with and may connect to respective sending and receiving components of the photonic interfaces 122, as discussed below. In this way, the photonic ports 120 facilitate connecting the compute node 104 to one or more bidirectional photonic channels to communicate photonically with other computing devices.

Each of the photonic ports 120 is associated with and connected to a corresponding photonic interface 122 (PI), i.e., photonic port 120-1 is connected to photonic interface 122-1, etc. The photonic interfaces 122 facilitate converting a message or a signal between the electronic domain and the photonic domain. In particular, each photonic interface, e.g., as illustrated for photonic interface 122-2, includes an electrical-to-optical (EO) interface 124 for converting electronic signals to optical, e.g., photonic, signals, and include an optical-to-electrical (OE) interface 126 for converting signals to electronic signals. While FIG. 1-2 only shows PI 122-2 as having the EO interface 124 and OE interface 126, it should be understood that each of the PIs 122 may include one or both of these interfaces and typically includes multiple each to support multiple unidirectional photonic links in both directions connecting to the port, for example, to support wavelength division multiplexing (WDM) or other scheme.

Figures 1, 2, 3:
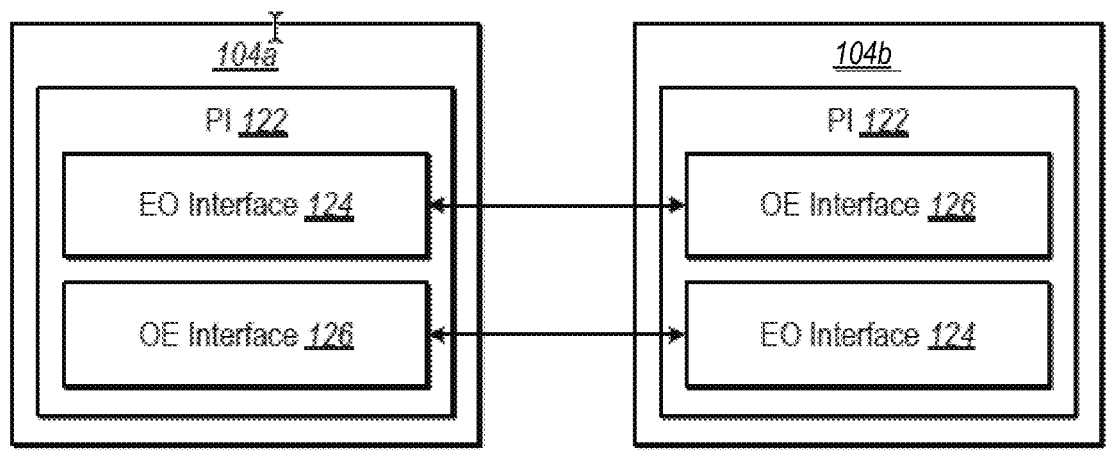

As discussed above, each bidirectional photonic channel may include two or more unidirectional photonic links. Each unidirectional photonic link may include or may be associated with both an EO interface 124 and an OE interface 126. For example, as shown in FIG. 1-3, an EO interface 124 of a compute node 104a connects, e.g., via photonic ports 120 and waveguides, etc., to an OE interface 126 of another computing device 104b, e.g., another instance of the compute node, to form a unidirectional photonic link for sending packets from the compute node 104a to the other computing device 104b. Similarly, an EO interface 124 of the other computing device 104b connects to an OE interface 126 of the compute node 104a to form a unidirectional link for receiving packets to the compute node 104a from the other computing device 104b. In this way, the PIs 122 may facilitate bidirectional communication over the bidirectional photonic channels connected to the photonic ports 120.

In some examples, the PIs 122 each include various optical and electronic components. For example, the EO interface 124 can include an optical modulator and an optical modulator driver. The optical modulator generally operates on an optical, e.g., laser light, carrier signal to encode information into the optical carrier signal and thereby transmit information optically/photonically. The optical modulator may be controlled or driven by the optical modulator driver. The optical modulator driver may receive an electronic signal, e.g., packet encoded into an electronic signal, from the message router 110 and may control a modulation of the modulator to convert or encode the electronic signal into the optical signal. In this way the optical modulator and driver may make up the EO interface 124 to facilitate optically transmitting messages from the compute node 104.

The modulator can be an electro-absorption modulator (EAM) which is a semiconductor device that modulates the intensity of an optical signal by varying absorption of the optical signal as it traverses the modulator based on an applied electric voltage to the EAM. Generally, the principle of operation of an EAM is based on the Franz-Keldysh effect, i.e., a change in the absorption spectrum caused by an applied electric field, which changes the bandgap energy and thus the photon energy of an absorption edge but usually does not involve the excitation of carriers by the electric field.

In examples, EAMs are made in the form of a waveguide with electrodes for applying an electric field in a direction perpendicular to the modulated optical signal. In certain examples, the EAM is implemented in a layer of Germanium Silicon, e.g., an epitaxially-grown layer of GeSi. Germanium can stoichiometrically constitute 90% or more of the GeSi material, e.g., 95% or more, 96% or more, 97% or more, 98% or more, 99% or more.

In some examples, the OE interface 126 includes a photodiode and a transimpedance amplifier (TIA). The photodiode receives an optical signal, e.g., from another computing device, through a unidirectional link of the bidirectional photonic channel and converts the optical signal into an electronic signal. The photodiode may be connected to the TIA which may include componentry and/or circuitry for gain control and normalizing the signal level to extract and communicate a bit stream to the message router 110. In this way, the OE interface 126 may include the photodiode and the TIA to facilitate optically receiving messages to the compute node 104.

In some examples, the PIs 122 are partially implemented in the PIC 102-1 and partially implemented in the EIC 101-1. For example, the optical modulator may be implemented in the PIC 102-1 and may be electrically coupled to the optical modulator driver implemented in the EIC 101-1. For example, the EIC 101-1 and the PIC 102-1 may be horizontally stacked and the optical modulator and the optical modulator driver may be coupled through an electronic interconnect of the two components such as a copper pillar and/or bump attachment of various sizes. Similarly, the photodiode may be implemented in the PIC 102-1 and the TIA may be implemented in the EIC 101-1. The photodiode and the TIA may be coupled through an electronic interconnect of the two components.

As shown in FIG. 1-2, each PI 122 is in communication with the message router 110. The PIs 122 are connected to the message router 110 through electronic interconnects in the EIC 101-1. The PIs 122 communicate with the message router 110 to transmit signals to and/or receive signals to or from the message router 110. In some examples, the message router 110 includes electronic circuitry and/or logic to facilitate converting a data packet into an electronic signal and then an optical signal in conjunction with the EO interface 124. Similarly, the message router 110 may include electronic circuitry and/or logic to facilitate converting an optical signal into an electronic signal and then into a data packet in conjunction with the OE interface 124. In this way the message router 110 may facilitate converting and/or operating on data between the electronic domain and the optical domain.

The message router 110 may facilitate routing information and/or data packets to and/or from the compute node 104. For example, the message router 110 may examine an address contained in the message and determine that the message is destined for the compute node 104. The message router 110 may accordingly forward or transmit some or all of the message internally to the various computing components 130 of the compute node 104, e.g., via an electronic connection. In another example, the message router 110 may determine that a message is destined for another computing device, e.g., the message either being generated by the compute node 104 or received from one computing device for transmission to another computing device. The message router 110 may accordingly forward or transmit some or all of the message through one or more of the channels, e.g., electronic or photonic, of the compute node 104 to another computing device. In this way, the message router 110 in connection with the electronic connections 128 and the bidirectional photonic channels connected to the photonic ports 120 may facilitate implementing the compute node 104 in a network of computing devices for generating, transmitting, receiving, and forwarding messages between various computing devices. In some examples, the compute node 104 is implemented in a network of multiple compute nodes 104 such as that shown in FIG. 1-1.

The PIC 102-1 includes one or more waveguides. A waveguide is a structure that guides and/or confines light waves to facilitate the propagation of the light along a desired path and to a desired location. For example, a waveguide may be an optical fiber, a planar waveguide, a glass-etched waveguide, a photonic crystal waveguide, a free-space waveguide, any other suitable structure for directing optical signals, and combinations thereof. In some examples, one or more internal waveguides are formed in the PIC 102-1. In certain examples, one or more external waveguides are implemented external to the PIC 102-1, such as an optical fiber or a ribbon comprising multiple optical fibers.

The PIC 102-1 may include one or more waveguides in connection with the photonic ports 120. For example, as will be discussed below in more detail, one or more of the photonic ports 120 may be connected to another port of another computing node included in the circuit package 100, e.g., on a same chip, as the computing node 104. Such connections may be intra-chip connections. In some examples, an internal waveguide is implemented, e.g., formed, in the PIC 102-1 to connect these photonic ports internally to the chip. In another example, one or more photonic ports 120 may be connected to a photonic port of another computing device located in a separate circuit package or separate chip to form inter-chip connections. In some examples, an external waveguide is used to connect these photonic ports across the multiple chips. For example, the photonic ports 120 may be connected via optical fiber across the multiple chips. In some examples, an external waveguide, e.g., optical fiber, connect directly to the photonic ports 120 of the respective computing devices across the multiple chips. In some examples, an external waveguide is implemented in connection with one or more internal waveguides formed in the PICs 102 of one or more of the chips. For example, one or more internal waveguides may internally connect the one or more of the photonic ports 120 to one or more additional optical components located at another portion of the circuit package, e.g., another portion of the PIC 102, to facilitate coupling of optical signals to and/or from the external waveguides. For example, the internal waveguides may connect to one or more optical coupling structures including fiber attach units (FAUs) located over grating couplers, or edge couplers. In some examples, one or more FAUs are implemented to facilitate coupling the external waveguides to the internal waveguides to facilitate chip-to-chip interconnection to another circuit package to both transmit and receive. For example, one or more FAUs can be used to supply optical power from an external laser light source to the PIC 102-1 to drive the photonics, e.g., provide one or more carrier signals, in the PIC 102-1.

FIG. 1-4 is a diagram illustrating a side view of an example structural implementation 1400 of the circuit package 100 of FIG. 1-1. In this example, an EIC 1401 and a PIC 1402 are formed in separate semiconductor chips, which are typically silicon chips, although the use of other semiconductor materials is possible. PIC 1402 is disposed directly on a substrate 1440, shown with solder bumps for subsequent mounting to a printed circuit board (PCB). The EIC 1401 and FAUs 1432 that connect the PIC 1402 to external waveguides 1433, e.g., optical fibers, are disposed on top of and optically connected to the PIC 1402. Optionally, and as will be discussed below, the circuit package 1400 may further include, as shown, an on-chip memory 1442 positioned on top of the PIC 1402 adjacent to the EIC 1401.

The depicted structure of the circuit package 1400 is merely one of several possible ways to assemble and package the various components. In some examples, some or all of the EIC 1401 is disposed on the substrate. In some examples, some or all of the PIC 1402 is placed on top of the EIC 1401. In some examples, it is also possible to create the EIC 1401 and PIC 1402 in different layers of a single semiconductor chip. In some examples, the photonic circuit layer includes or is made of multiple PICs 1402 in multiple sub-layers. Multiple layers of PICs 1402, or a multi-layer PIC 1402, may help to reduce waveguide crossings. Moreover, the structure depicted in FIG. 1-4 may be modified to included multiple EICs 1401 connected to a single PIC 1402. For example, the multiple EICs 1401 may be connected to each other via photonic channels in the PIC 1402.

In general, the EICs and PICs described herein can be manufactured using standard wafer fabrication processes, including, e.g., photolithographic patterning, etching, ion implantation, etc. Further, in some examples, heterogeneous material platforms and integration processes are used. For example, various active photonic components, such as the laser light sources and/or optical modulators and photodetectors used in the photonic channels, may be implemented using group III-V semiconductor components.

The laser light source or sources can be implemented either in the circuit package 1400 or externally. When implemented externally, a connection to the circuit package 1400 may be made optically using a grating coupler in the PIC 1402 underneath an FAU 1432 as shown and/or using an edge coupler. In some examples, lasers are implemented in the circuit package 1400 by using an interposer containing several lasers that can be co-packaged and edge-coupled with the PIC 1402. In some examples, the lasers are integrated directly into the PIC 1402 using heterogenous or homogenous integration. Homogenous integration allows lasers to be directly implemented in the silicon substrate in which the waveguides of the PIC 1402 are formed, and allows for lasers of different materials, such as indium phosphide (InP), and architectures such as, quantum dot lasers. Heterogenous assembly of lasers on the PIC 1402 allows for group III-V semiconductors or other materials to be precision-attached onto the PIC 1402 and optically coupled to a waveguide implemented on the PIC 1402.

As will be discussed in further detail below, several circuit packages 1400, may be interconnected to result in a single system providing a large electro-photonic network, e.g., by connecting several chip-level electro-photonic networks as described below. Multiple circuit packages configured as ML processors may be interconnected to form a larger ML accelerator. For example, the photonic channels within the several circuit packages or ML processors, the optical connections, the laser light sources, the passive optical components, and the external optical fibers on the PCB, may be utilized in various combinations and configurations along with other photonic elements to form the photonic fabric of a multi-package system or multi-ML-processor accelerator.

FIG. 2-1 illustrates an example of a circuit package 300 implementing an intra-chip bidirectional photonic channel 342 between a first compute node 304-1 and a second compute node 304-2. The circuit package 300 includes various electronic and optical components implemented across an EIC 301 and a PIC 302. Package 300 includes two compute nodes 304-1 and 304-2, collectively, compute nodes 204, which each include a respective compute block 358-1 and 358-2 which may include various processing, storage, and/or communication functions. The compute nodes 304 each include an AMS block 360-1 and 360-2, collectively, AMS blocks 360, that includes analog/mixed signal circuits for interfacing with the PIC 302. The compute blocks 358 each include an interface 292-1 and 292-2, collectively, interfaces 292, for communicating with the AMS blocks 360, or more specifically, with the componentry of the AMS blocks 360. The AMS blocks 360 each include a modulator driver 362-1 and 362-2, collectively, drivers 362, and each include a transimpedance amplifier 364-1 and 364-2, collectively, TIAs 264.

The PIC 302 includes a pair of modulators 356-1 and 356-2 and a pair of photodetectors 366-1 and 366-2. The PIC 302 also includes a grating coupler 354 or any other optical interface (OI) configured to receive and pass on light to one or more components and a splitter 368.

A light engine 350 provides an optical carrier signal for communication between the first compute node 304-1 and second compute node 304-2. The light engine 350 provides the carrier signal to a FAU 332 of the circuit package 300, such as through an optical fiber. The FAU 332 is optically coupled to the grating coupler 354 which directs the optical carrier signal on to other components of the electronics package 300. A splitter 368 receives the optical carrier signal from the grating coupler 354 and splits the optical signal along two optical paths 370 and 372. More generally, the splitter 368 may distribute the optical carrier signal over any number of photonic paths consistent with that described herein. The optical paths 270 and 272 may be implemented as any suitable optical transmission medium, and may include a mixture of waveguides and optical fibers, or any other transmission medium consistent with that described herein. In the present example, the optical paths 270 and 272 are implemented as waveguides in the PIC 302.

The optical paths 370 and 372 pass from the splitter 368 to the optical modulators 356-1 and 356-2, respectively. Each optical modulator modulates the optical carrier signal it receives from the splitter 368 based on information from its respective optical driver 362-1 and 362-2 and transmits the modulated signal along the respective optical path. A first photodetector 266-1 receives the modulated signal from the optical path, e.g., from the associated modulator 256. As depicted, the optical path from modulator 356-1 connects to photodetector 266-2 and the optical path from modulator 356-2 connects to photodetector 266-1. The photodetectors convert the received modulated signal into respective electrical signal and pass the electrical signals to a transimpedance amplifiers 264 which facilitate the compute nodes 304-1 and 304-2 receiving the information encoded in the signals. In this way, communication occurs between the compute nodes through the various components just described. The PIC 302 described here includes an example of an intra-chip bidirectional photonic channel, including two unidirectional photonic links for facilitating communications both to and from each compute node. Here, the first unidirectional photonic link is defined by the modulator driver 362-1, the optical modulator 356-1, the optical path 370, the photodiode 366-2, and the transimpedance amplifier 364-2. Similarly, the second unidirectional link is defined by the modulator driver 362-2, the optical modulator 356-2, the optical path 370, the photodiode 366-1, and the transimpedance amplifier 364-1. The first and second unidirectional links operate in opposite directions. Additionally, one or more of the compute nodes 304 may include one or more serializes and/or a deserializes for further facilitating communications of signals between the compute nodes 304. In this way, the two unidirectional photonic links form the intra-chip bidirectional photonic channel 342.

FIG. 2-2 illustrates an example circuit package 200 implementing an inter-chip bidirectional photonic channel between the compute node 304 and an additional compute node 254 located on an additional circuit package 290, such as a memory node on a memory circuit package. The compute node 304 and/or the electronics package 200 may include the EIC 301 and the PIC 302 including the components discussed above in reference to FIG. 2-1. Further, PIC 302 includes a demultiplexer 380 and a multiplexer 390. In general, a demultiplexer and multiplexer can be used in a PIC for wavelength division multiplexing of optical signals.

In the inter-chip configuration shown in FIG. 2-2, the optical modulator 356 transmits a modulated signal along an optical path 374 to the grating coupler 354. The modulated signal is passed through the multiplexor 390 prior to passing to the grating coupler 354. From the grating coupler 354, the modulated signal travels through the FAU 332 and along an optical fiber to another grating coupler of the additional circuit package 290, where the receiving componentry of the additional circuit package 290 receives and processes the incoming signal. The receiving componentry may be the same as or similar to the receiving componentry of the circuit package 300 discussed above, or may include any other means for receiving and processing the incoming signal.

Similarly, the additional circuit package 290 generates and transmit a signal to the compute node 304. The additional circuit package 290 may generate and transmit the signal using transmitting componentry that may include transmitting componentry similar to or the same as that of the circuit package 300 discussed above, or any other means. The additional circuit package 290 transmits a signal, for example, along an optical fiber to the FAU 332 and grating coupler 354 of the compute node 304. The signal travels along an optical path 276 to the photodetector 366 which converts the optical signal to an electrical signal as discussed herein. The received signal passes through the demultiplexer 280 prior to passing to the photodetector 266. In this way, an inter-chip bidirectional photonic channel is defined by two unidirectional photonic links. Here, the first unidirectional photonic link is defined by the modulator driver 362, the optical modulator 356, the optical path 374, the multiplexor 378, the grating coupler 354, the FAU 332, an optical fiber, and receiving componentry of the additional circuit package. Similarly, the second unidirectional photonic link is defined by the transmitting components of the additional circuit package 290, the optical fiber, the FAU 332, the grating coupler 354, the demultiplexer 380, the optical path 376, the photodetector 366, and the transimpedance amplifier 364. The first and second unidirectional photonic links operate in opposite directions. In this way the two unidirectional photonic links forms the inter-chip bidirectional photonic channel.

FIG. 3-1 is a diagram illustrating an example of a circuit package 3000 implementing multiple compute nodes 3004. Each compute node 3004, and, more specifically, a message router in each compute nodes 3004, connects to one or more electronic channels 3040. The compute nodes 3004, e.g., via the message routers, direct messages transmitted over the electronic channels 3040, such as that described herein in reference to FIG. 1-2. Additionally, the circuit package includes an EIC 3001 and a PIC 3002, with the compute nodes 3004, routers, and electronic channels 3040 being implemented on the EIC 3001 as described herein. The circuit package may include additional circuitry and/or componentry in addition to that shown in FIG. 3-1.

The sixteen compute nodes 304 are arranged in a four by four array are indexed, for ease of reference, according to the cartesian coordinates [0,0] through [3,3] as shown. The array of the compute nodes 3004 includes four corner nodes, eight non-corner edge nodes, hereinafter "edge nodes", and four interior nodes. More generally, circuit packages may include any number of compute nodes, and the compute nodes may be arranged in any array, configuration, or arrangement consistent with the techniques described herein.

The compute nodes 3004 are intra-connected through multiple electrical channels 3040. In particular, each compute node 3004 is connected to each adjacent compute node 3004 via one of the electrical channels 3040. In this way, the corner nodes are each connected to two adjacent nodes through two electrical channels, the edge nodes are each connected to three adjacent nodes through three electrical channels, and the interior nodes are connected to four adjacent nodes through four electrical channels. In this way, the compute nodes 304 form an electronic network 3041 for communicating and/or transmitting messages between the compute nodes 3004 via the electronic channels 3040. Each of the compute nodes 3004 is connected either directly, e.g., to adjacent nodes, or indirectly through one or more other nodes to all other compute nodes 3004. The connecting of all adjacent compute nodes 3004 via the electrical channels 3040 in this way represents a maximum adjacency configuration for the electronic network 3041 in that all adjacent nodes are connected. This may facilitate a more complete, faster, and/or more robust electronic network providing a maximum amount of transmission paths between nodes and/or through the network, as will be described herein in further detail. In this way, the electronic network 3041 may be configured in a rectangular mesh topology.

More generally, electronic networks connecting compute nodes can be configured according to other topologies. For example, one or more nodes may not be connected to all adjacent nodes, e.g., one or more of the electronic channels 3040 of the rectangular mesh topology may be omitted. For example, every node may be connected to at least one other node and may accordingly be intra-connected to all other nodes, but may not necessarily be connected to each adjacent node. In a non-limiting example, each interior node may be connected to only one edge node and no other nodes. Any number of topologies for electronically intra-connecting all compute nodes 3004 without connecting all adjacent nodes will be appreciated by one of ordinary skill in the art, and such configurations are contemplated by this disclosure. The connecting of all nodes with a less-than-maximum adjacency configuration in this way may represent an intermediate adjacency configuration, e.g., less than all adjacent nodes connected, or even a minimum adjacency configuration, e.g., minimum amount of adjacent connections to maintain connectivity of all nodes. Intra-connecting the compute nodes 3004 in a less-than-maximum adjacency configuration in this way may simplify the design, production, and/or implementation of an electronic network and/or a circuit package. For example, such a configuration may simplify determining transmission paths through the network to facilitate simpler routing of messages.

In some examples, one or more electrical channels 3040 connect non-adjacent nodes. This may be in connection with either of the maximum adjacency or less-than-maximum adjacency configurations just discussed. Such a configuration may increase or even maximize use of configurable electronic connections for each compute node 3004 to increase the robustness and speed of the electronic network 3041.

The intra-connection of the compute nodes 3004 in this way may facilitate transfer of messages through the electronic network 3041. For example, messages may be directly transferred between routers of any two compute nodes 3004 that are directly connected, e.g., adjacent. Message transfer between any two compute nodes 3004 that are not directly connected may also be accomplished by passing the message through one or more intervening compute nodes 3004. For example, for a message originating at node [0,3] and destined for transmittal to node [1,2], the router for node [0,3] may transmit the message to the router for node [0,2] which may then ultimately forward or transmit the message to the router for node [1,2]. Similarly, transmittal of the message could be implemented through the path [0,3]-[1,3]-[1,2]. In this way, messages may be transmitted between any two indirectly connected, e.g., non-adjacent, nodes by one or more "hops" along a path through one or more intervening compute nodes 3004 within the electronic network 3041.

As described herein, each of the compute nodes 3004 may be configured to connect to one or more, e.g., up to four, bidirectional photonic channels for two-way data transmission between nodes. As will be appreciated by one of ordinary skill in the art, photonic channels are typically faster and more energy efficient than electronic channels as distance or resistance increases. As will be discussed in connection with the various configurations below, in some examples, various compute nodes 3004 are connected through bidirectional photonic channels to leverage the speed and energy efficiency of the photonic channels for an improved network. In some examples, however, adjacent compute nodes 3004 are not intra-connected with bidirectional photonic channels, but rather are still connected through the electronic network 3041 shown and described in reference to FIG. 3-1. Implementing the electronic network 3041 in this way for adjacent connections may allow the photonic ports of each compute node 3004 to be utilized for, e.g., up to four, bidirectional photonic connections with non-adjacent nodes, and nodes included in other circuit packages as described herein. This may help to increase speed, robustness, and completeness of the network of compute nodes 3004 despite employing the slower, less-efficient electronic connections for adjacent nodes. For example, transmittal speed and energy efficiency for electronic channels typically diminishes with distance, while photonic channels can maintain a high speed and energy efficiency over longer distances. Accordingly, utilizing the electronic channels 3040 for short interconnects between, e.g., closely adjacent nodes while implementing the faster, more energy efficient photonic connections for connections between more distant nodes can increase the overall and/or average speed of the network as well as reduce the energy consumption. In this way, implementing the electronic network 341 may facilitate improved network performance by enabling the various configurations of the photonic channels and network topologies described below. The foregoing hardware configuration can allow for flexibility when code is executed because software schemes, compilers, schedulers, and the like, can take advantage of and/or route packets through electronic or photonic channels in a manner most advantageous for the needs off the algorithm that is being executed.

As is evident in the example network of FIG. 3-1, the further the separation between two nodes, the greater the number of hops and the greater the amount of possible transmission paths between the two nodes. For example, to transmit a message from node [0,1] to node [3,2] at least four hops are needed. In a more extreme case, a message transmitted between node [0,0] and node [3,3], can be accomplished in no less than six hops. In some examples, one or more non-adjacent compute nodes 304 are connected to facilitate reducing a number of hops for one or more transmission paths between the compute nodes 3004.

FIGS. 3-2 and 3-3 are each diagrams illustrating an example of the circuit package 300 of FIG. 3-1 with multiple connections between non-adjacent compute nodes 304. The plurality of non-adjacent connections may be implemented either separately or in connection with the adjacent connections discussed above in reference to FIG. 3-1.

In some examples, the circuit package 3000 includes one or more intra-chip bidirectional photonic channels 3042. The intra-chip bidirectional photonic channels 3042 are implemented in the PIC 3002. In some examples, the intra-chip bidirectional photonic channels connect one or more pairs of non-adjacent compute nodes 3004. For example, one or more of the compute nodes 3004 positioned along a periphery of the array, e.g., corner and edge nodes or "peripheral nodes", may be connected to another peripheral node through an intra-chip bidirectional photonic channel 3042. In some examples, all of the peripheral nodes are connected to another peripheral node through an intra-chip bidirectional photonic channel 3042. In some examples, each peripheral node is connected to a peripheral node at an opposite end of the array. For example, each corner node is connected to the two corner nodes on adjacent sides of the array, such as node [0,3] being connected to node [3,3] and node [0,0]. Additionally, each edge node is connected to the one edge node positioned on the opposite side of the array, e.g., in a same position on the opposite side of the array. For example, edge node [2,0] is connected to edge node [2,3], and edge node [0, 1] to edge node [3,1]. None of the interior nodes are connected to the intra-chip bidirectional photonic channels 3042. In this way, each side of the array may be wrapped, or connected to the opposite side of the array through the connections of the peripheral nodes by the intra-chip bidirectional photonic channels 3042.

The intra-chip bidirectional photonic channels 3042 are implemented in the PIC 3002. For example, as described above, each compute node 3004 may include one or more photonic ports in a PIC layer of the compute node 3004, and a waveguide may connect photonic ports of a pair of compute nodes 3004. In some examples, the waveguide is an internal waveguide implemented or formed in the PIC 3002. In this way the PIC 3002 may be manufactured with the waveguides included for implementing the intra-chip bidirectional photonic channels 3042. In some examples, the waveguides include an external waveguide such as an optical fiber for implementing the intra-chip bidirectional photonic channels 3042.

The intra-chip bidirectional photonic channels 3042 may be implemented in addition to the electrical channels 3040 connecting the compute nodes 3004 into the electronic network 3041. For clarity and for ease of discussion, the electronic channels 3040 are not shown in FIG. 3-2, but can be seen implemented in conjunction with the intra-chip bidirectional photonic channels 3042 in FIG. 3-3. The combination of the compute nodes 3004 being connected through the electronic channels 3040 and the intra-chip bidirectional photonic channels 3042 in this way may form an electro-photonic network 3043, e.g., an intra-chip electro-photonic network. The electro-photonic network 3043 may be an intra-chip network of the compute nodes 3004, and may configure the compute nodes as a two-dimensional torus interconnect. In this way, the electro-photonic network 3043 may have a toroidal mesh topology. For example, while the compute nodes 3004 may be physically implemented in a two-dimensional planar array, each side of the plane may "wrap" around to an opposite side, e.g., left-right and top-bottom, such that the array may conceptually take the shape of a torus. In this way, adjacent nodes are directly connected, and peripheral nodes are conceptually "adjacent" and directly connected to the peripheral nodes on the opposite side of the array through the intra-chip bidirectional photonic channels 3042.

The toroidal mesh topology of the electro-photonic network 3043 in this way helps to reduce an average number of hops between pairs of compute nodes 3004 in the network. In the example given above, the transmission path between node [0,1] and node [3,2] required a minimum of four hops through the electronic network 3041. By implementing the electro-photonic network 3043 including the intra-chip bidirectional photonic channels 3042, the transmission of a message from node [0,1] to node [3,2] can be accomplished in just two hops, e.g., [0,1]-[3,1]-[3,2]. Similarly, the transmission path from node [0,0] to [3,3] is reduced from six hops in the electronic network 3041 down to two hops in the electro-photonic network 3043. In this way, implementing the electro-photonic network 3043 may increase the speed, reliability, and robustness of the network of compute nodes 3004 by enabling delivery of messages through less hops. Additionally, the electro-photonic network 3043 may accordingly reduce an overall amount of traffic that individual routers process as a message traverses the network.

Figures 1, 2, 3, 4:
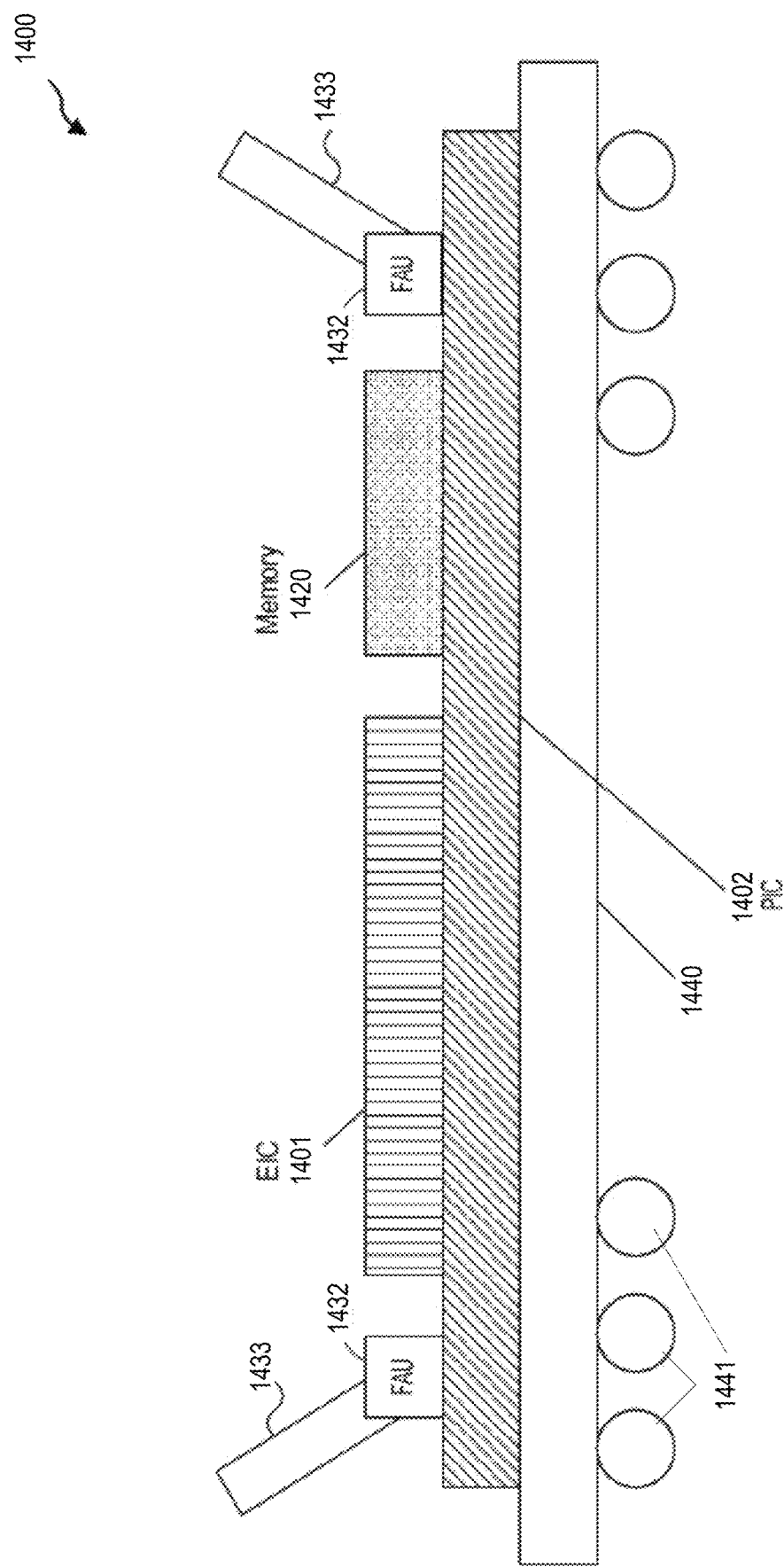
Figures 1, 2:
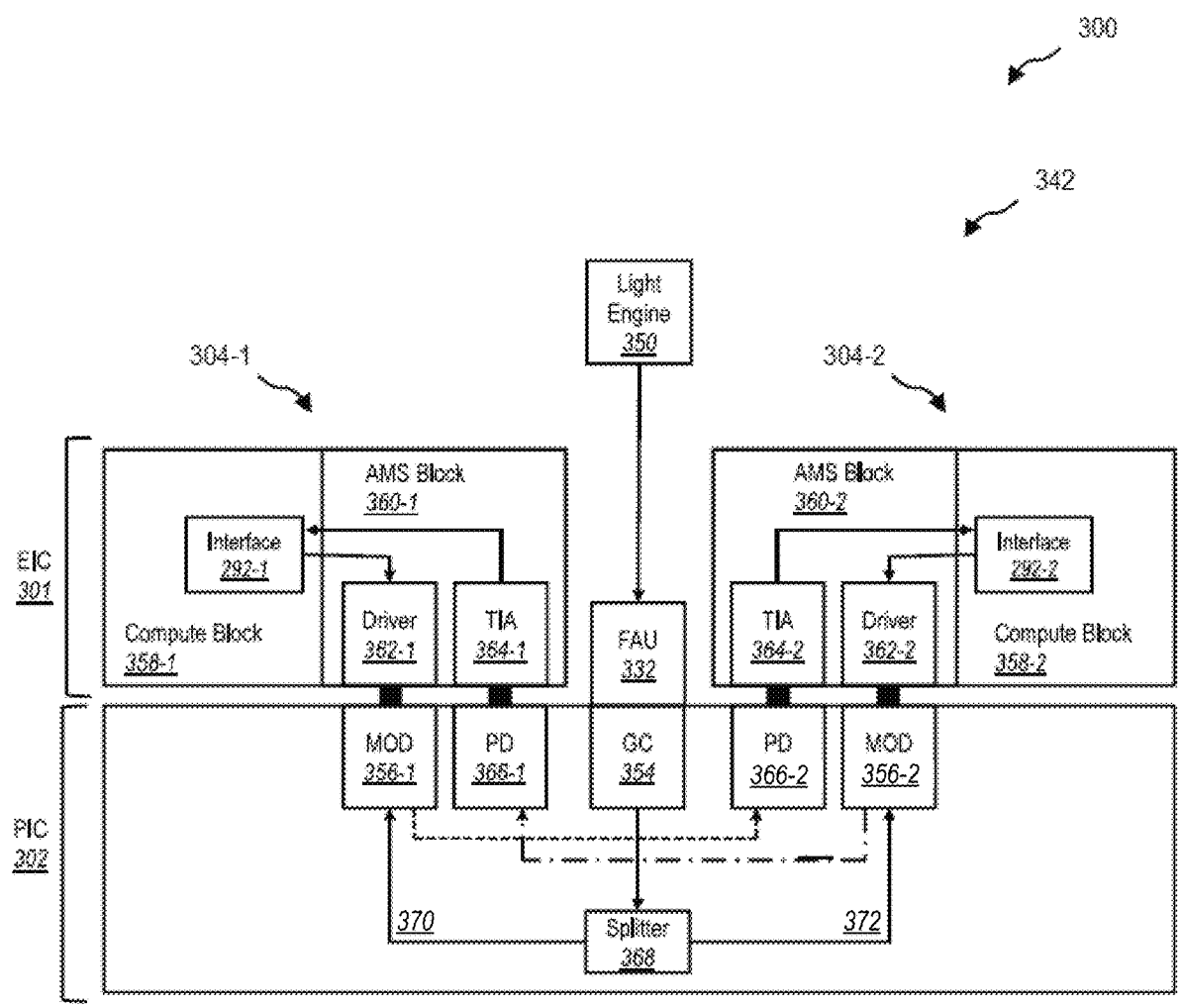
Figure 2:
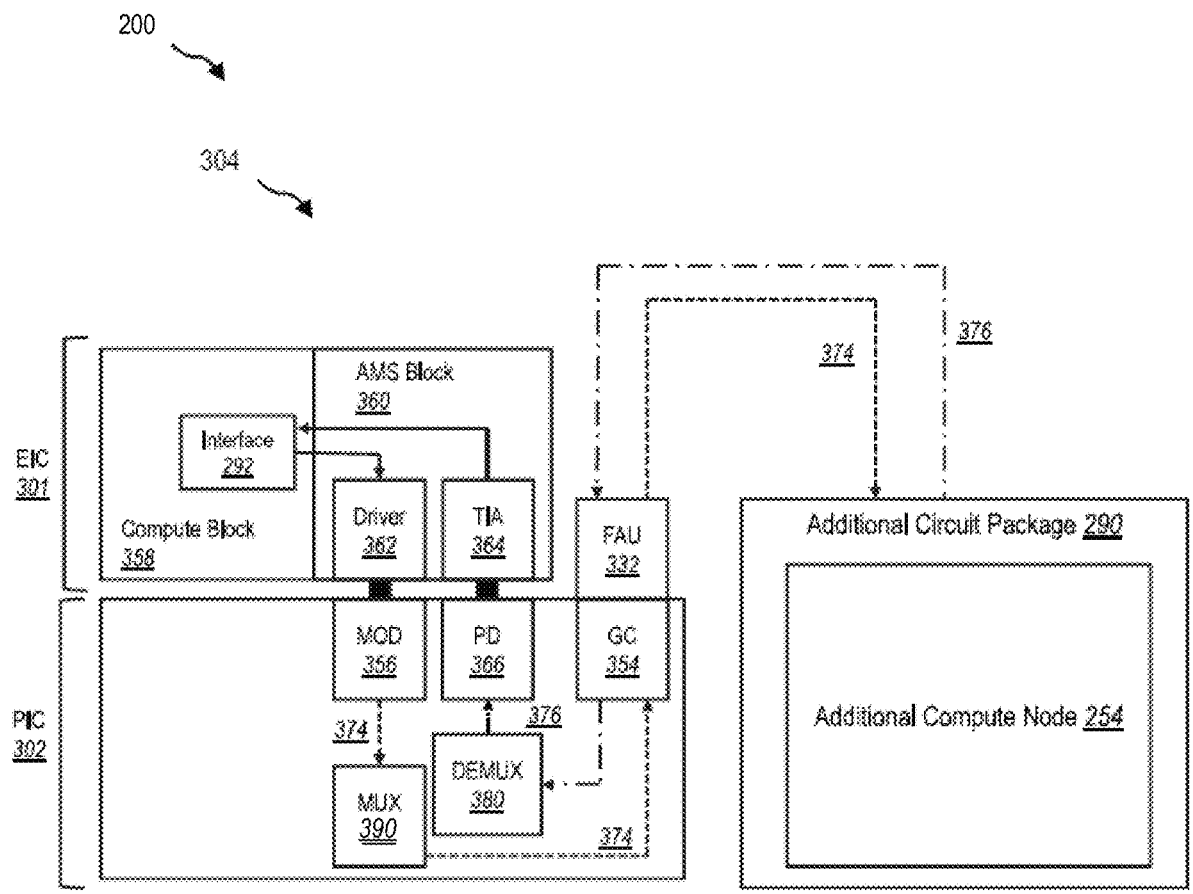

FIG. 3-4 is a diagram illustrating an example of the circuit package 300 of FIG. 3-1 implementing multiple connections to one or more additional circuit packages. The circuit package 300 may include one or more inter-chip bidirectional photonic channels 344 to connect one or more of the compute nodes 304 to one or more additional computing devices of one or more other circuit packages. The inter-chip bidirectional photonic channels 344 may be implemented either separately or in connection with the electronic channels 340 discussed above in reference to FIG. 3-1 and/or the intra-chip bidirectional photonic channels 342 discussed above in reference to FIGS. 3-2 and 3-3.

In some examples, the inter-chip bidirectional photonic channels 3044 are implemented using exterior waveguides such as optical fibers. For example, an optical fiber may couple with any suitable optical interface, e.g., an FAU as described in reference to FIGS. 2-1 and 2-2, included in the circuit package 3000 to connect to the photonic port or ports of one or more compute nodes 3004 through an interior waveguide. In some examples, an optical fiber connects directly to a photonic port of one or more compute nodes 3004 without an interior waveguide. The optical fiber may have a similar connection with one or more computing devices of a separate circuit package with which it connects. For example, the optical fiber may connect two circuit packages by connecting to an FAU of each circuit package. One or more optical fibers connected in this way may form one or more unidirectional photonic links including drivers, modulators, waveguides, grating couplers, FAUs, photodiodes, and transimpedance amplifiers associated with each circuit package. In this way, the inter-chip bidirectional photonic channels may be formed using any of the components described herein in reference to FIGS. 2-1 and 2-2.

In some examples, the inter-chip bidirectional photonic channels 3044 connect to one or more of the peripheral nodes. In some examples, each of the peripheral nodes connect to an inter-chip bidirectional photonic channel 3044. For example, each corner node may connect to two inter-chip bidirectional photonic channels 3044, and each edge node may connect to one inter-chip bidirectional photonic channel 3044. The connection of the peripheral nodes in this way may facilitate connecting and/or arranging multiple circuit packages into a grid or array. For example, as will be discussed in further detail below, in some examples, the multiple circuit packages 3000 are connected together in an array to form a larger interconnect and/or network via the inter-chip bidirectional photonic channels 3044. In some examples, the circuit package 3000 connects to similar or complimentary circuit packages in place or in addition to connecting to identical or other instances of the circuit package 3000. In this way, the inter-chip bidirectional photonic channels 3044 may facilitate incorporating the circuit package 3000 and the compute nodes 3004 into a larger inter-chip network.

In some examples, the circuit package 3000 includes the inter-chip bidirectional photonic channels 3044 in addition to the electronic channels 3040 and the intra-chip bidirectional photonic channels 3042 described above. For clarity and for case of discussion, only the inter-chip bidirectional photonic channels 3044 are shown in FIG. 3-4, but an implementation with all of the channels can be seen in FIG. 3-5. The combination of the compute nodes 3004 being connected through the electronic channels 3040, the intra-chip bidirectional photonic channels 3042, and the inter-chip bidirectional photonic channels 3044 in this way may form a larger, inter-chip electro-photonic network 3045. For example, the inter-chip bidirectional photonic channels 3044 may facilitate joining or connecting the, e.g., intra-chip, electro-photonic network 3043 with intra-chip networks of one or more other circuit packages into a larger, more robust network.

In the various example described and shown in reference to FIGS. 3-2 to 3-5 and other examples described herein as well, the various photonic channels, both inter-chip and intra-chip, have been depicted as connected or terminating at an edge of the compute nodes 3004. It should be understood, however, that these depictions are intended to be illustrative of the connectivity of the various components described herein and are not intended to be limiting with respect to an actual physical layout or implementation of the various components. For example, the various photonic channels may extend within or underneath the compute nodes 3004. The various channels may terminate or end at a transceiver or AMS block of the compute nodes 3004. The various channels may terminate or end at a central region or location within the compute nodes 3004. Additionally, while the compute nodes 3004 are shown as connecting to the various channels at North, East, South, and/or West positions of the compute nodes 3004, it should be understood that this is merely illustrative and the photonic ports of the compute nodes 3004 may be located at any location with respect to the compute nodes 3004, including one or more photonic ports at the same or adjacent location. For example, all four photonic ports of a compute node 3004 may be located at the same location of the compute node 3004.

In some examples, the circuit package 3000 is connected via the inter-chip bidirectional photonic channels 3044 to one or more additional circuit packages 3000. FIG. 4 is illustrates an example implementation of four of the circuit packages 300 of FIG. 2-1 being interconnected. In particular, a system 400 includes circuit packages 300' arranged in a two-dimensional array. The circuit packages 300' include a circuit package 300-1 (top-left), 300-2 (top-right), 300-3 (bottom-left), and 300-4 (bottom-right). As shown, the peripheral (corner, or non-corner, edge) nodes on each side of a circuit package that is adjacent a side of another circuit package may connect directly to a corresponding, adjacent node on the adjacent circuit package via inter-chip bidirectional photonic channels 344. In this way, the circuit packages 300-1 to 300-4, form a grid of 64 compute nodes 304 arranged in eight rows of eight adjacent and directly connected compute nodes 304.

In some examples, each of the circuit packages 300' include the electronic connections between adjacent nodes and/or the intra-chip bidirectional photonic channels between peripheral nodes. For clarity, such connections are not shown in FIG. 4. In this way, the benefits discussed above of the intra-connectivity of the compute nodes 304 within a single circuit package may similarly be applied to the inter-connectivity of multiple circuit packages 300' into a larger, inter-chip network. For example, what would take 10 hops through adjacent nodes to transmit a message from the top-left node of circuit package 300-1 to the bottom-right node of circuit package 300-2 may be achieved in 4 hops by utilizing the intra-chip bidirectional photonic channels connecting peripheral nodes within each circuit package as described above.

As shown, all of the peripheral nodes of each circuit packages 300' are connected to one or more inter-chip bidirectional photonic channels 344. For example, in addition to adjacent sides of the circuit packages 300' being directly connected, one or more of the peripheral nodes on non-adjacent sides, e.g., on a periphery of the inter-chip grid, may also be directly connected to other nodes. Any number of configurations or topologies of the inter-chip electro-photonic network 345 may be contemplated by inter-connecting nodes with the inter-chip bidirectional photonic channels 344. Such configurations may reduce and/or minimize a number of hops between pairs of compute nodes 304 by leveraging the configurability of each compute node 304 to connect to two or more photonic channels—in this example four are shown. In this way, high network efficiency and flexibility for various routing schemes, depending on the algorithm being executed, may be maintained even for networks implementing multiple circuit packages and/or large numbers of compute nodes.

Figures 1, 3:
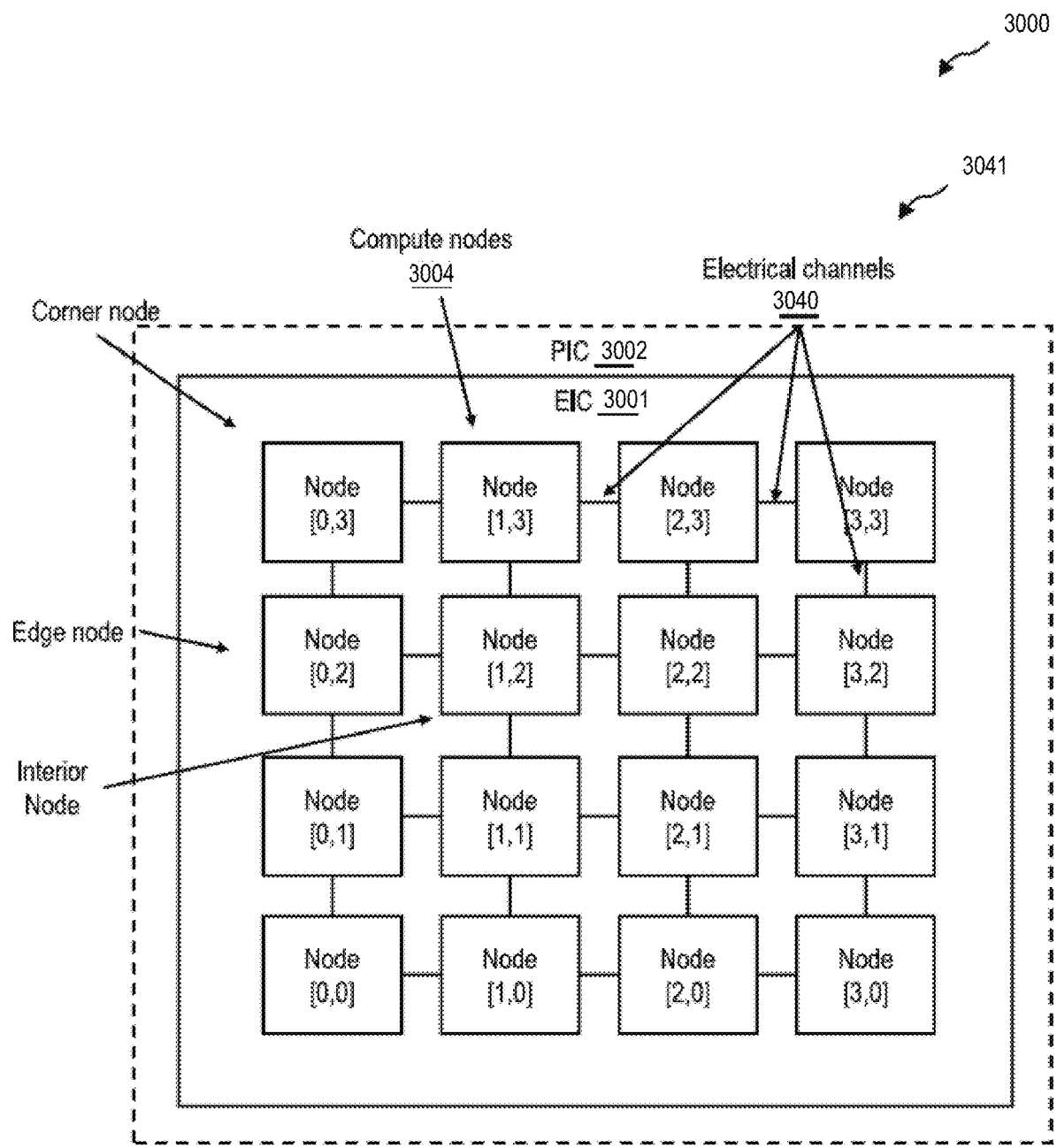
Figures 2, 3:
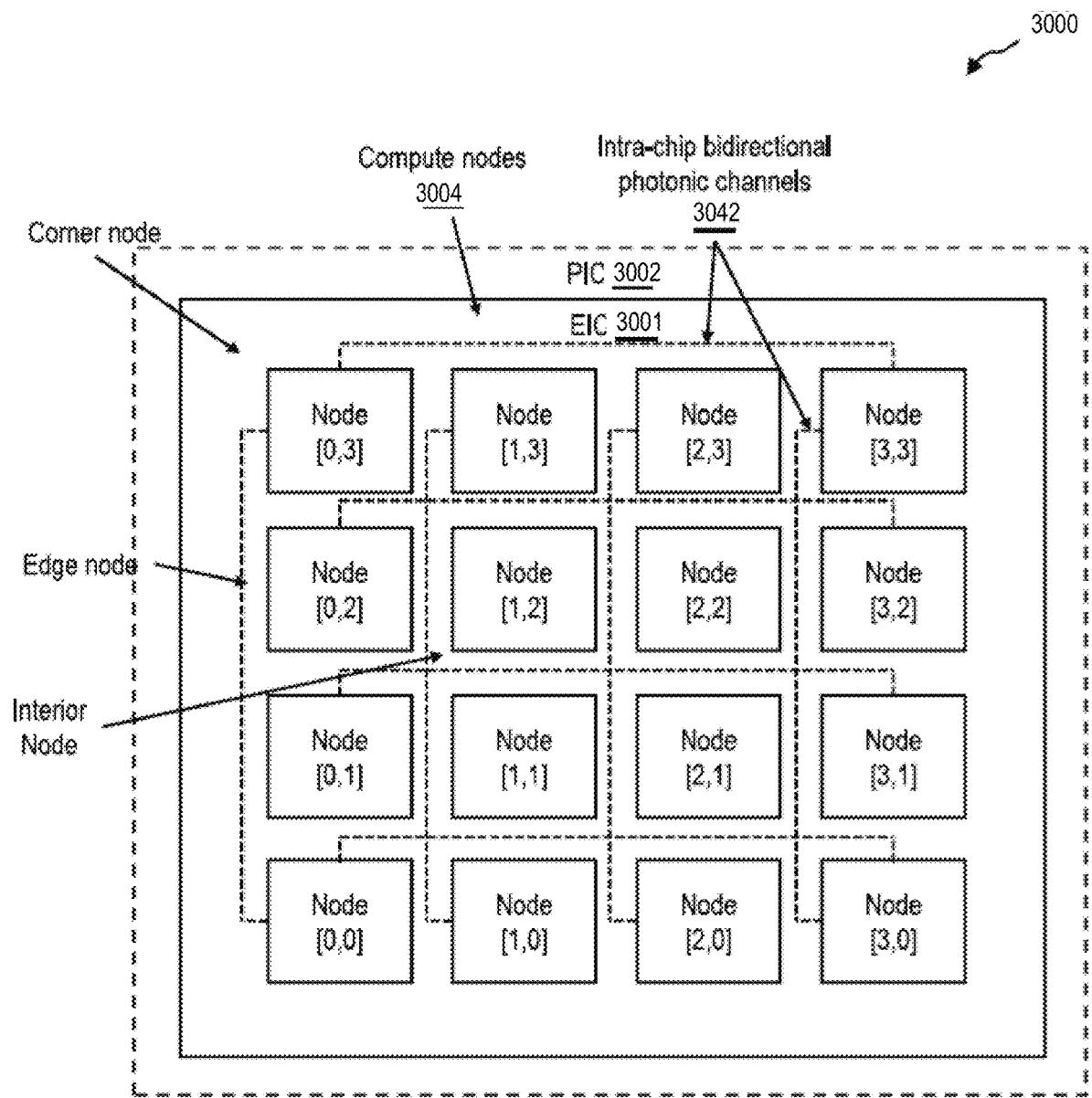
Figure 3:
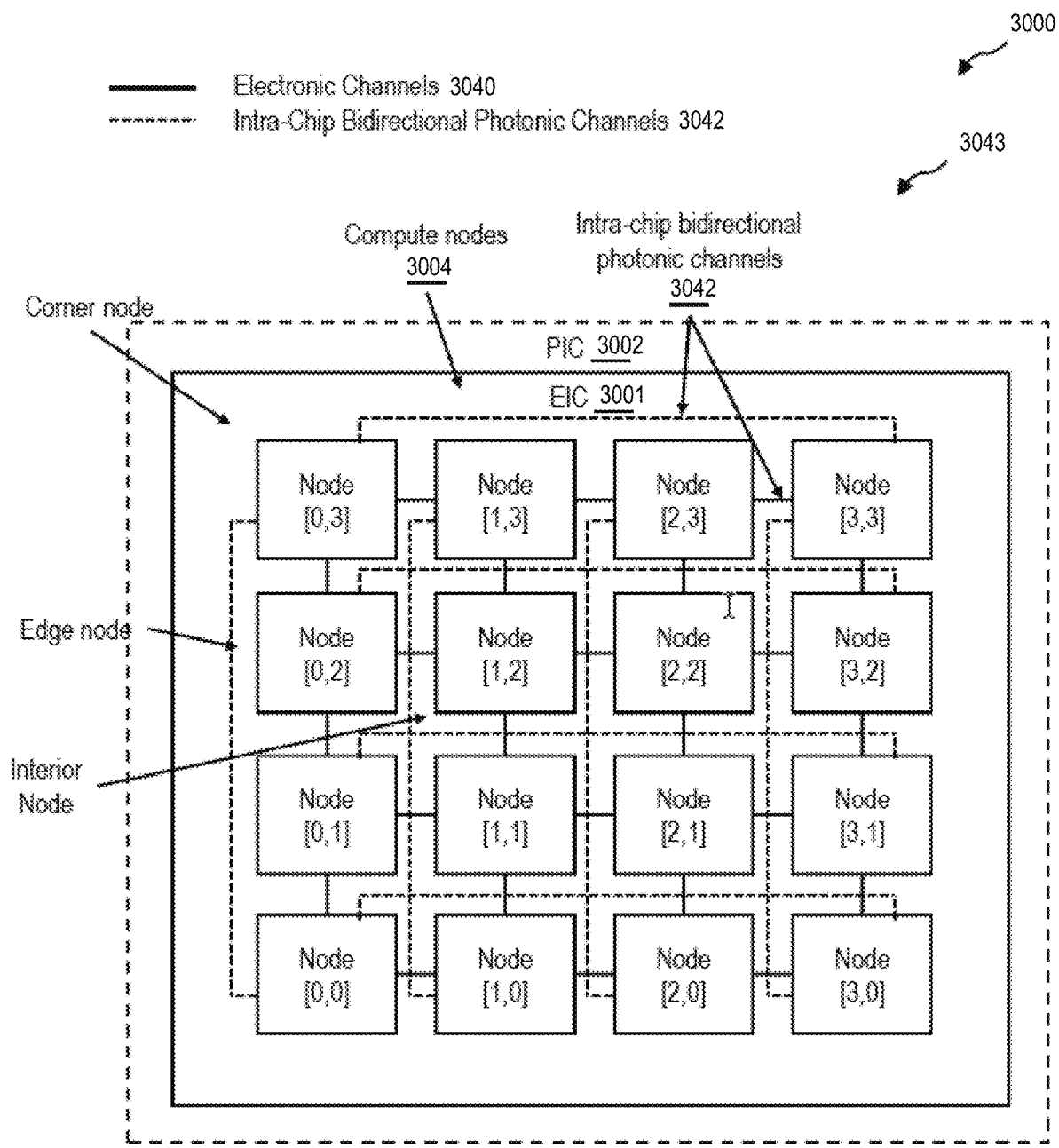
Figures 3, 4:
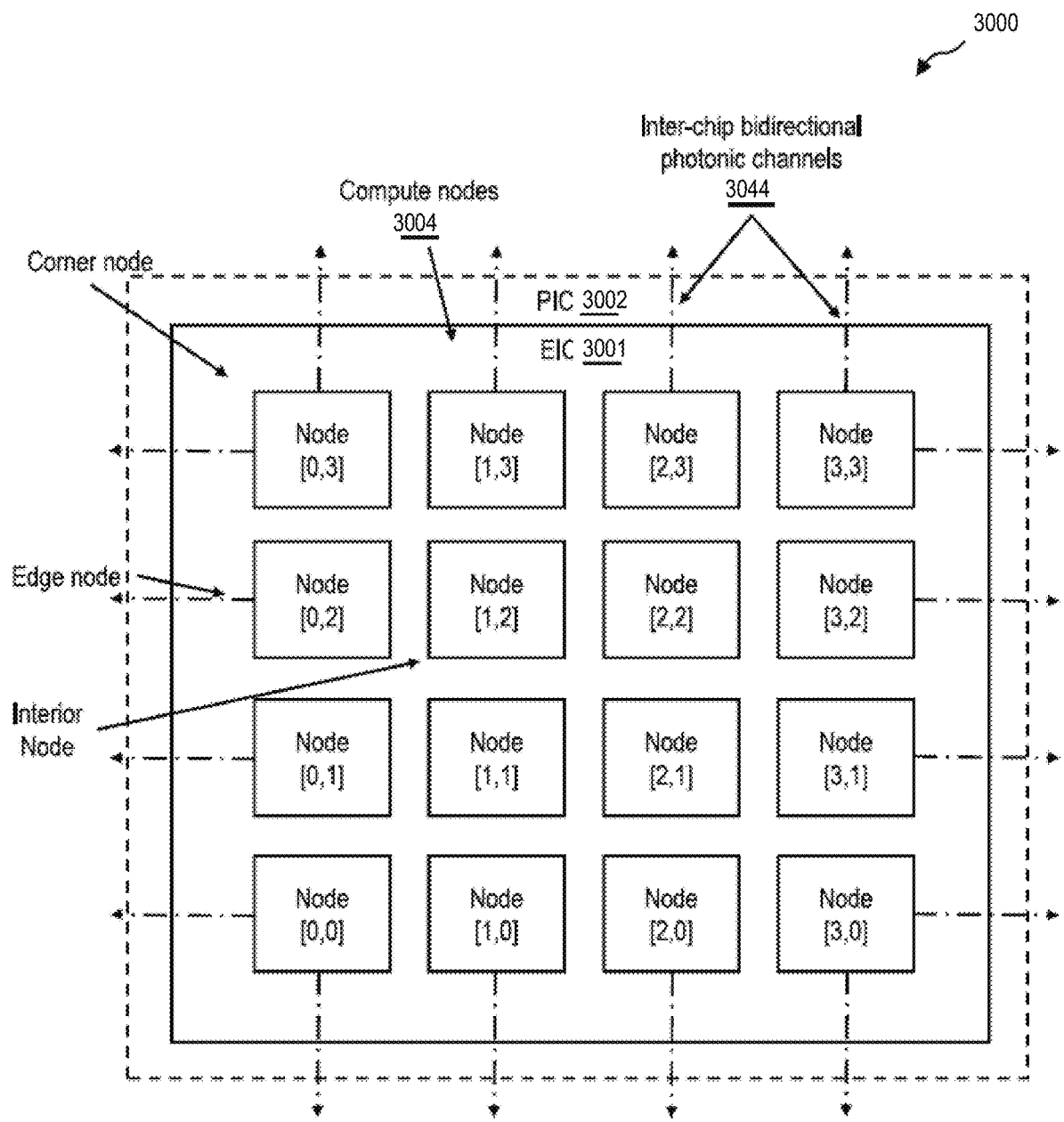
Figures 3, 4, 5:
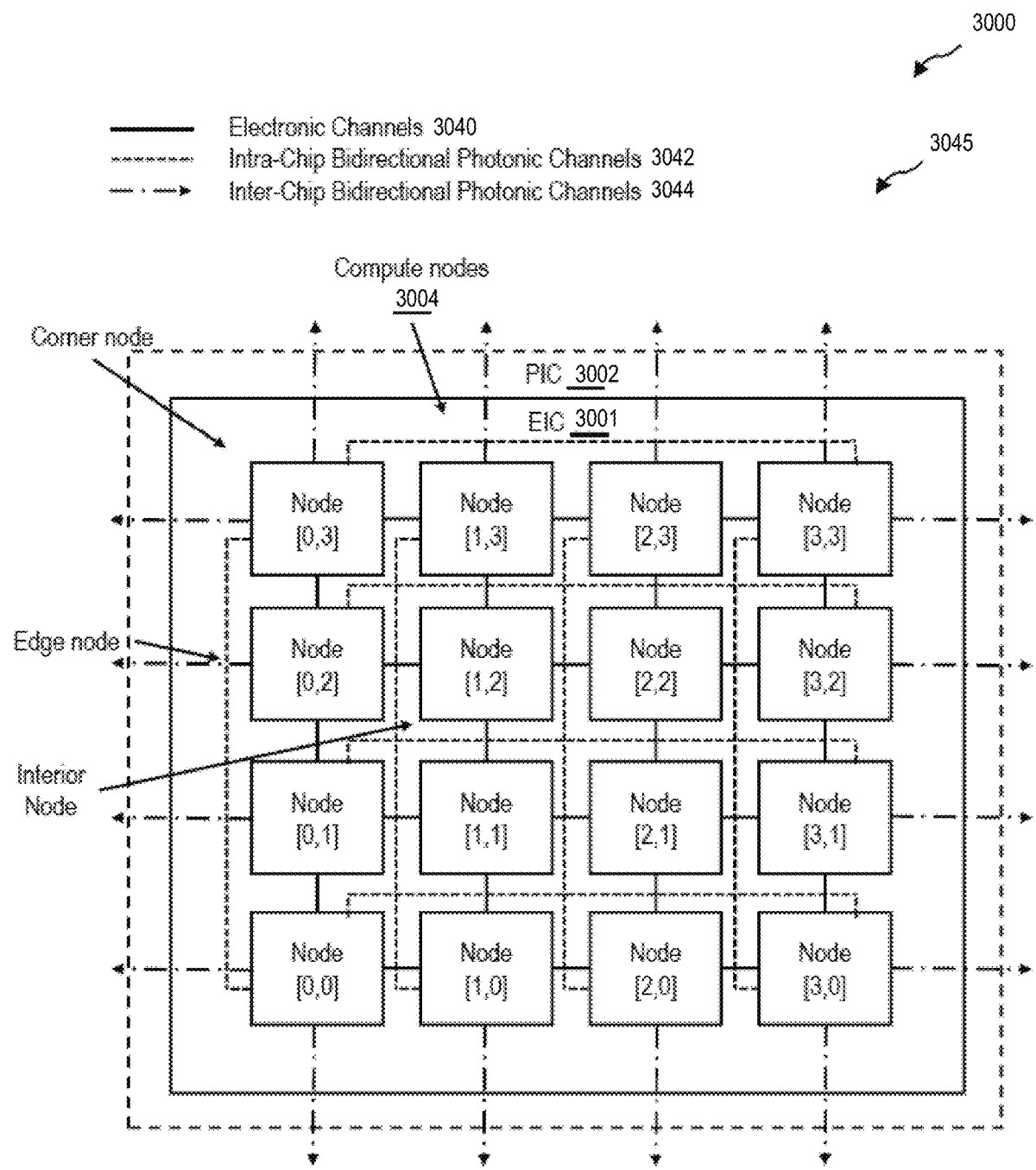
Figure 4:
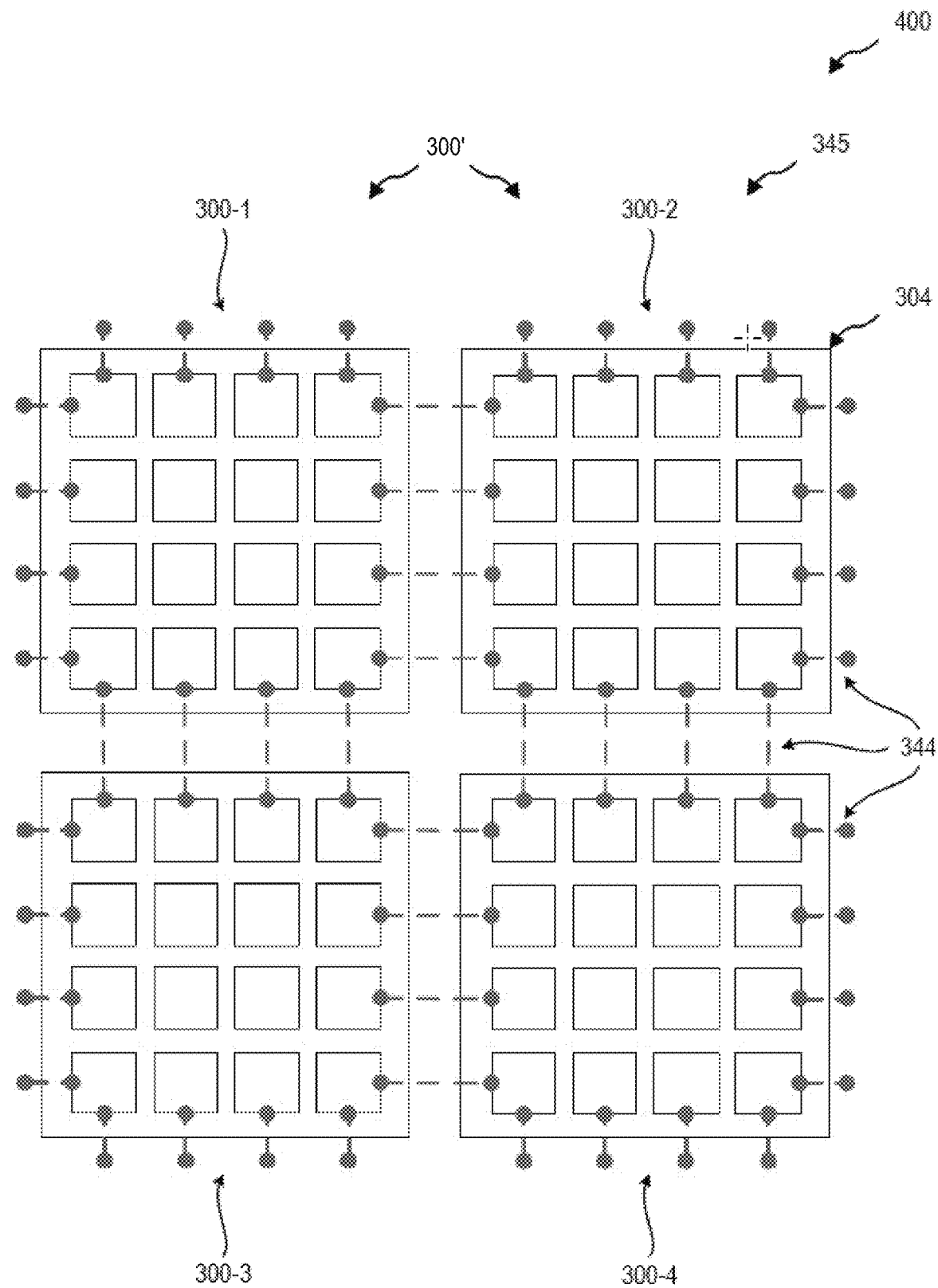
Figures 1, 5:
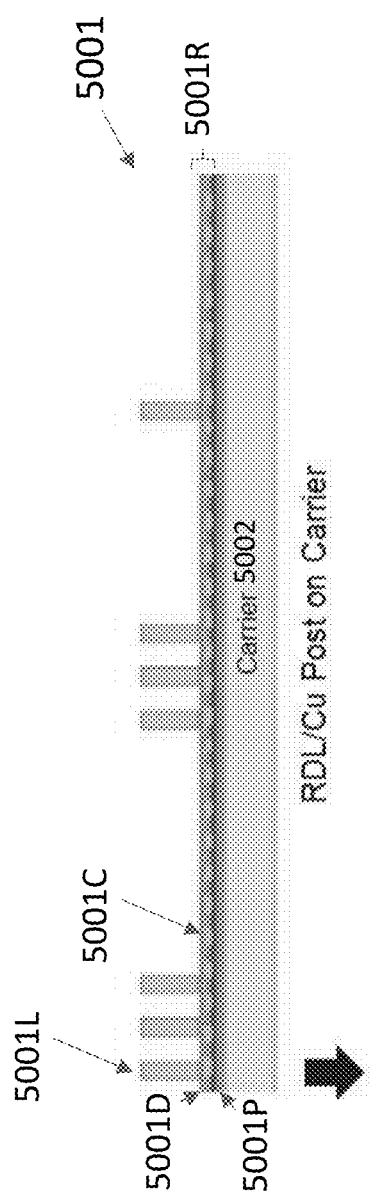
Figures 2, 5:
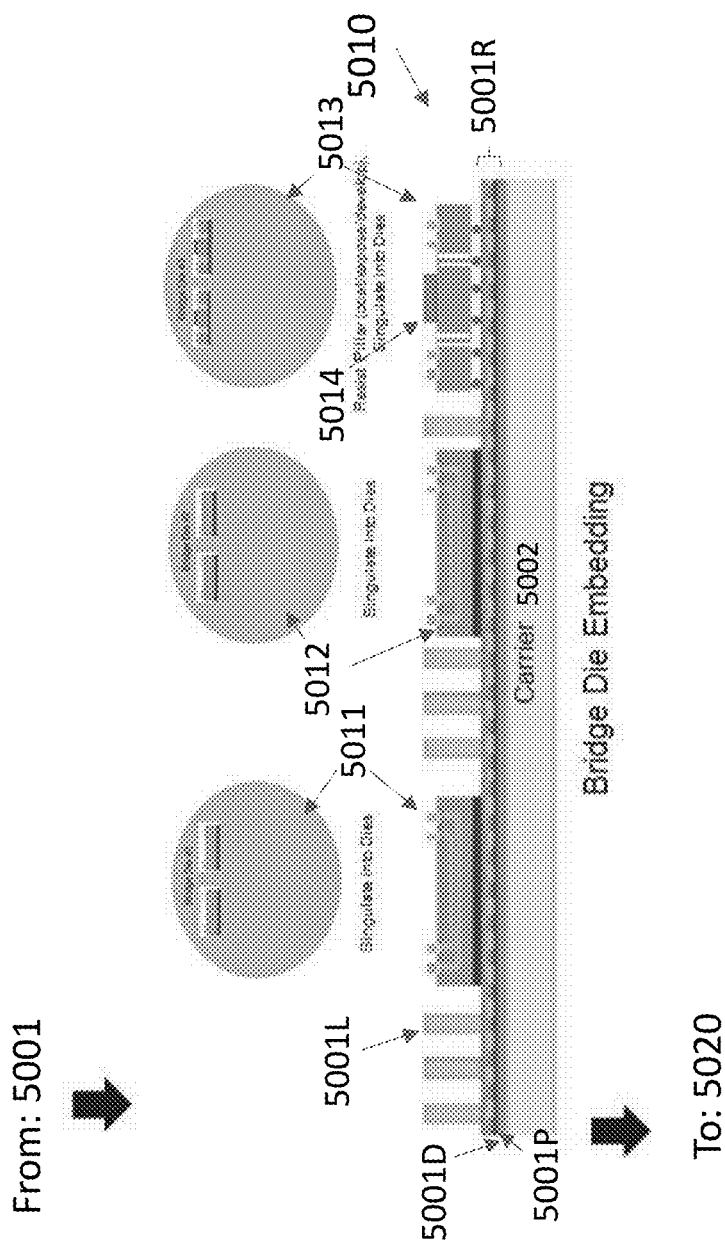
Figures 3, 5:
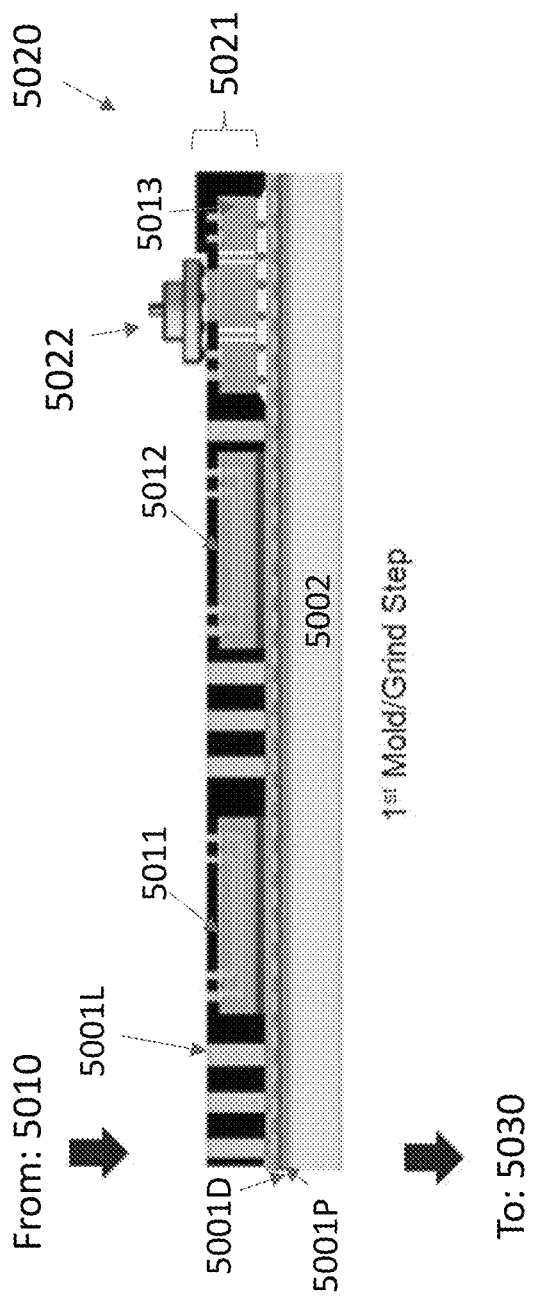
Figures 4, 5:
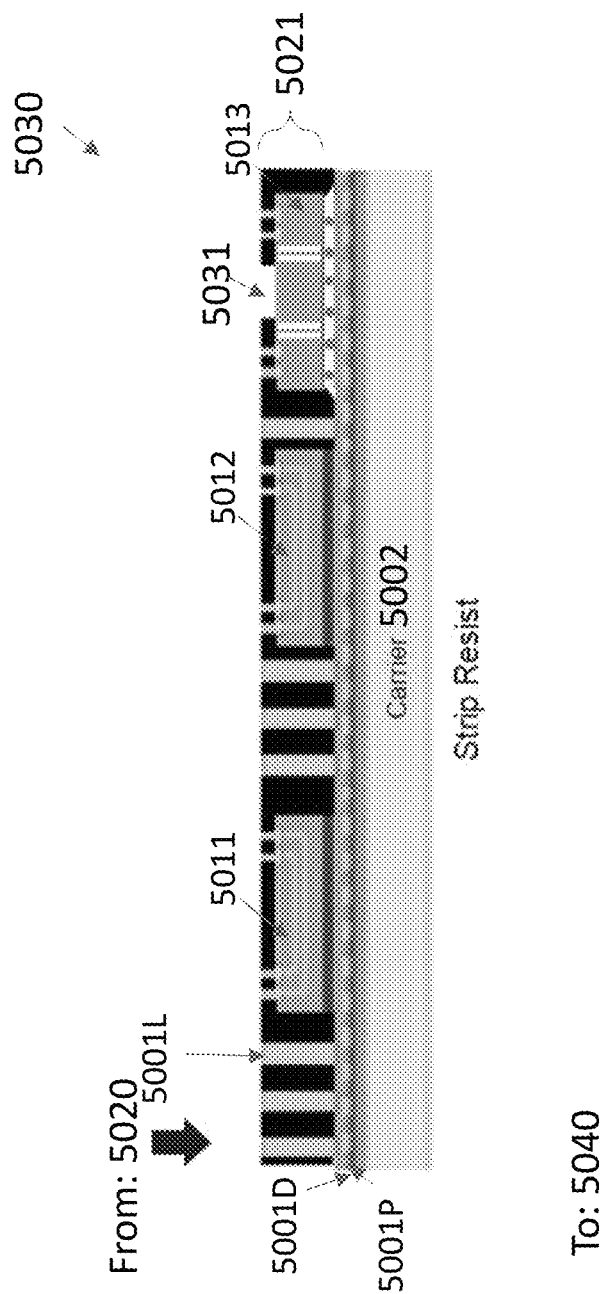
Figure 5:
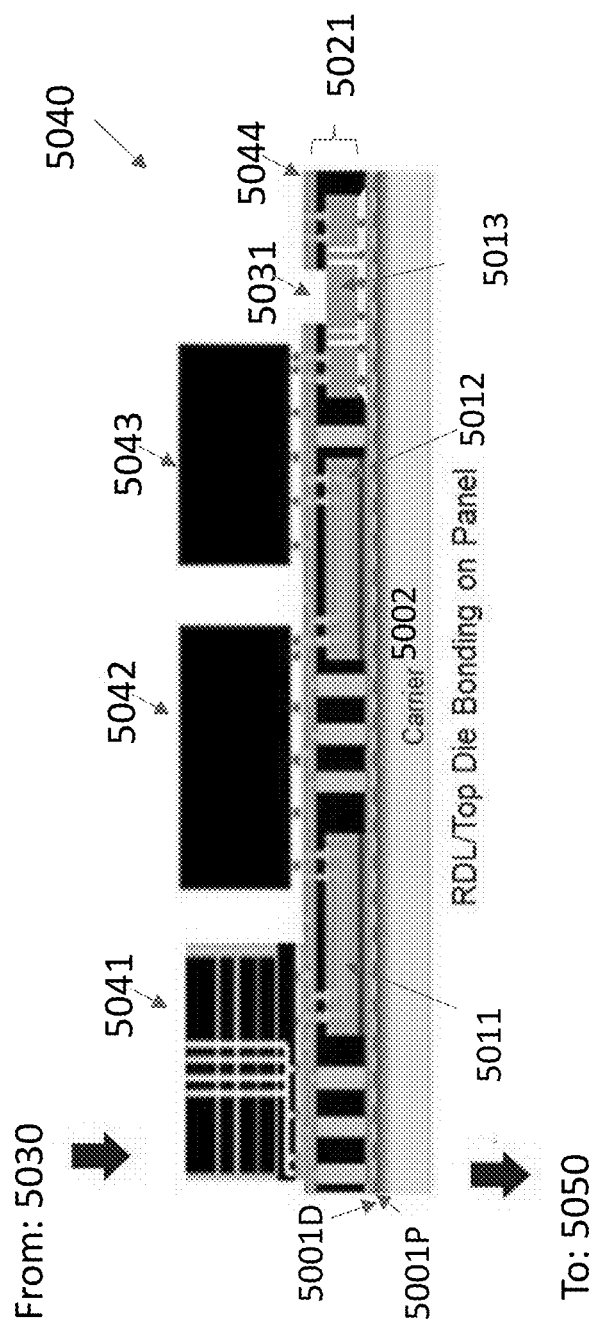
Figures 5, 6:
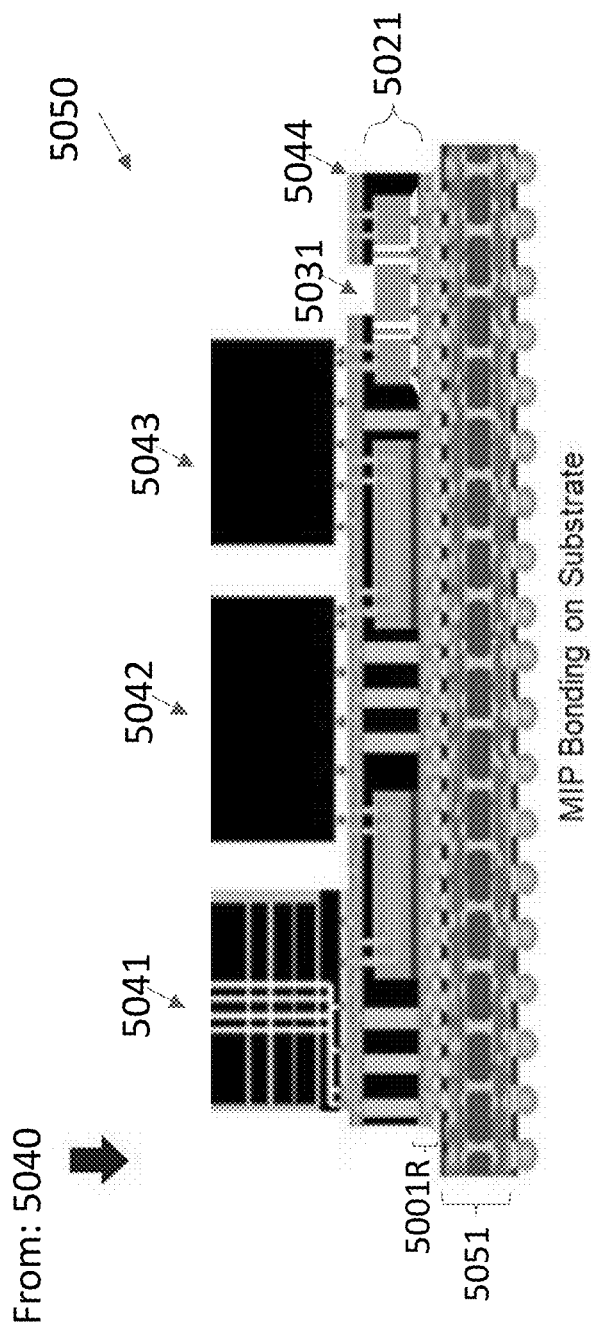
Figure 6:
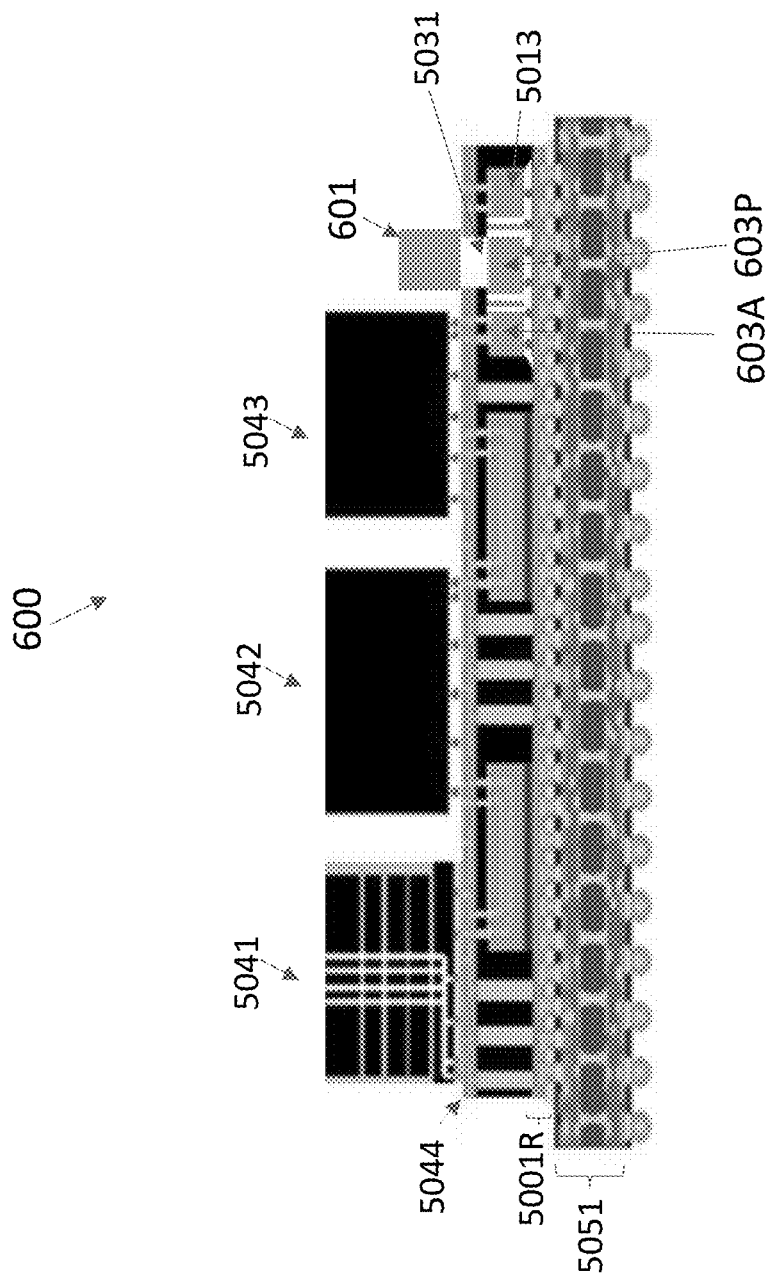

FIG. 5-1 to FIG. 5-6 illustrate steps in an example process 5000 for packaging a EIC-PIC stack on a semiconductor substrate, e.g., as depicted in various examples shown above in FIGS. 1-1 to 4 where the EIC and the PIC are mutually coupled (e.g., in FIG. 2-2, driver 363 on EIC 301 is coupled to modulator 356 on PIC 302 to modulate optical carrier signal while photodetector (PD) 366 on PIC 302 is coupled to transimpedance amplifier 364 on EIC to provide the detected electrical signal). In a combined EIC-PIC stack, one technical challenge is to provide a path for coupling the optical carrier signal, e.g., C-band or L-band laser light, from outside a package to the PIC of the package. Process 5000 is an example of a solution for addressing the technical challenge of providing the optical carrier signal to the PIC stacked under the EIC, such as those stacked arrangements depicted in various examples shown above in FIGS. 1-1 to 4.

FIG. 5-1 shows that at step 5001, a redistribution layer (RDL) 5001R and copper (Cu) pillars 5001C, shown as posts, are grown on carrier 5002. The RDL 5001R is for redistributing the input/output (I/O) connections from the original, often fine-pitched, bond pads on the die to a different pitch or arrangement that matches the requirements of the package or interposer. This allows for better connectivity between the integrated circuit and the external components, such as other chips or the package substrate. Forming an RDL layer can include forming a wiring layer of copper and an insulating layer. In some cases, growing the RDL formation may include applying plasma during the formation process for descum, cleaning, hydrophilization of surface modified substrate, and control of surface shape, all of which can prevent the oxidization and corrosion of copper wiring. As illustrated, RDL 5001R may include dielectric layer 5001D and passivation layer 5001P. Dielectric layer 5001D may include polyimide or other low-k dielectrics to facilitate formation of signal traces. Passivation layer 5001P may include a protective coating to effectively prevent environmental factors such as moisture and contaminants from affecting the integrity of the RDL and the underlying semiconductor structure. Copper pads 5001C are embedded for electrically connecting the RDL to the underlying substrate. Copper studs 5000L are disposed for connecting to one or more EICs in the EIC-PIC stack. Carrier 5002 can be a glass carrier.

FIG. 5-2 shows that at step 5010, semiconductor dies 5011, 5012, and 5013 are positioned on RDL 5001R and carrier 5002. For example, dies 5011, 5012, and 5013 can be positioned on RDL 5001R temporarily bonded to a glass carrier using a glue. The glass carrier can be later peeled off using laser irradiation to remove the temporary bond. Here, each of dies 5011, 5012, and 5013 can be formed using die singulation, also known as wafer dicing, which is a manufacturing process to separate apart the individual dies on a finished wafer via wafer dicing for further packaging and assembly. Dies 5011, 5012, and 5013 are examples of bridge dies, which are not limited in any specific number. Significantly, dies 5011, 5012, and 5013 are embedded in the package so that the dies can bridge, for example, intra-chip data communication between various components to be positioned above the dies in the package. As discussed above in reference to FIGS. 2-1 and 2-2, PIC 302 may be formed in die 5013. For example, modulators 356-1 and 356-2 and photodetectors 366-1 and 366-2 can be formed in die 5013, along with grating coupler 354 and optical transmission medium, e.g., waveguides or fibers.

A photoresist coating 5014 is formed over a portion of a surface of die 5013 that is opposite from carrier 5002. The photoresist coating 5014 may be formed by spraying droplets of photoresist material. Additionally, or alternatively, the formation may use 3D printing. This portion of die 5013 generally corresponds to photonic ports of an active photonic component on PIC 302. Here, an active photonic component refers to the bulk of an optical modulator, e.g., modulators 356-1 and 356-2, without the electrodes or electrical contacts, or the bulk of a photodetector, e.g., photodetectors 366-1 and 366-2, without the electrodes or electrical contacts. An active photonic component, when activated, e.g., powered on, consumes electrical power provided by the EIC. On the PIC, the portion hosting the active component is also referred to as an active portion of the PIC. The active portion consumes electrical power when the active photonic component is activated. For example, an optical modulator or a photodetector both operate using electrical power. By way of illustration, the remaining portion on the PIC may be referred to as the passive portion of the PIC. The passive portion of the PIC may provide, for example, optical transmission medium, e.g., waveguides and fibers, grating coupler 354, and optical ports, e.g., optical input or output ports. The photoresist coating 5014 may mask the passive portion of the PIC.

FIG. 5-3 shows that at step 5020, a packaging material is applied to the top side of the assembly from step 5010 and dies 5011, 5012, and 5013 are encased in layer 5021. Examples of packaging materials include epoxy molding compounds (EMC), also known as epoxy resins or duroplast. In some cases, the layer (5021) of packaging material can be about 100 μm in thickness. Thereafter, the packaging material is polished, using, for example, a polishing pad 5022, and partially removed to expose the photoresist coating 5014.

FIG. 5-4 shows that at step 5030, the photoresist coating 5014 is dissolved using a solvent so that cavity 5031 is exposed. As illustrated, cavity 5031 is defined by the volume that had been occupied by photoresist coating 5014. Because an active photonic component, e.g., optical modulator or photodetector absent the electrodes, is on the PIC, a clear optical pathway is provided by, e.g., cavity 5031 made using a curable material. For example, the curable material can fill cavity 5031 so that the photonic ports, e.g., input and output photonic ports, for the active photonic component can be optically coupled to a fiber array unit (FAU) once the curable material is cured to become a solid and optically transparent material. Here, "optically transparent" generally refers to favorable transmissibility within the operational optical wavelength. In case of L-band light, the operational wavelength is about 1565 nm to 1625 nm, which falls in the near infrared band. For other bands within the telecom optical wavelength bands, e.g., C-band, the operational wavelength can vary accordingly. An example of favorable transmissibility is low attenuation, also known as transmission loss, through the medium. For example, the transmission loss can be under 1 dB per kilometer. An example of the curable material is an ultraviolet (UV) curable epoxy. The curable material, once solidified, provide an optical refractive index substantially matched to that of the FAU or the optical transmission medium of the passive photonic component. In various cases, the curable material can be 15, 20, or 30 μm in thickness. The cavity can be between about 3 mm in width and 40 mm in length. The FAU can be a fiber bundle including, for example, 42 channels. Each channel can include an optical fiber, e.g., a single-mode fiber (SMF). As discussed above in reference to FIGS. 2-1 and 2-2, FAU 332 can be coupled to photonic ports of PIC 302 through grating coupler (GC) 354. The grating coupler can be mounted on a photonic port of the PIC. The grating coupler can also be mounted on a port of the FAU. Additionally, or alternatively, the FAU can also be coupled to the photonic port through an edge coupler, as described above in reference to FIG. 1-4.

FIG. 5-5 shows that at step 5040, a high-bandwidth memory (HBM) 5041, a processor 5042, and an EIC 5043 are attached to the top side of the assembly resulting from step 5030, for example, by copper pillars using mechanical pressing. For example, copper pillars can be judiciously disposed on landing pads on EIC 5043 for mating with plated holes on landing pads on die 5013 constructed as a PIC. In this example, the plated hole may be about 10 μm in diameter laterally while the copper pillar can be sized 30 μm or less, for example, about 20 μm laterally. Because the copper pillar is sized larger than the hole 5601, no precise alignment is needed when mating. In some cases, another RDL layer 5044 may be disposed between the layer 5012 of packaging material and the high-bandwidth memory (HBM) 5041, processor 5042, and EIC 5043 stacked above. Implementations are not limited to the exact order of arrangement or specific number of memory/processor/EIC, as shown in FIG. 5-5. Here, EIC 5043 is stacked over the PIC being coupled to the FAU. Bridge dies 5011 and 5012 operate electric bridges for HBM 5041 and processor 5042. Moreover, EIC 5043 operates as a bridge between the PIC and HBM 5041 and processor 5042. As noted above, HBM 5041, processor 5042, and EIC 5043 may each have a local clock while the assembly operates by mesochronous clocking.

FIG. 5-6 shows that at step 5050, carrier 5002 is peeled off, for example, using laser irradiation, thus debonding a temporary bond formed by glue, as described above with reference to step 5001. Once carrier 5002 is peeled off, the assembly is bonded to a substrate 5051, which can be a printed circuit board (PCB), for example, a high-density interconnect (HDI) PCB. The bonding can be formed using a molded interposer package (MIP) process. Electrical connections are formed, e.g., using wire traces, between the assembly and the substrate. For example, the anodes of modulator and photodiode can be electrically connected to a bias voltage on the substrate.

Additionally, or alternatively, at step 5010, a first layer of curable material, rather than photoresist coating, can be provided over the portion of a surface of die 5013 that is opposite from carrier 5002. The curable material may be cured to become a solid and transparent material before applying the packing material at step 5020. Here, the packaging material may be polished to expose the first layer of curable material so that an optically transparent window can be provided to access the photonic ports of the active photonic component. Thereafter, the implementations may deposit a second layer of curable material over this optically transparent window and optically couple the photonic ports of the active photonic component to the FAU, e.g., when the second layer of curable material is cured.

FIG. 6 shows an example EIC-PIC package 600 with fiber array unit FAU 601 receiving, for example, C-band or L-band light from a laser source, and transmitting the laser light through cavity 5031 filled with cured epoxy that is transparent to the light.

Specifically, FAU 601 may include a multitude of optical channels each configured to transport, e.g., C-band or L-band, light at a particular wavelength to or from the PIC, as illustrated above in reference to FIGS. 1-4, 2-1, and 2-2. In some cases, the FAU may have 42 optical channels including 16 channels for transmitting light to the PIC, 16 channels for receiving light from the PIC, 8 channels for providing optical illumination power and 2 dummy channels for indicating optical alignment, for example, between the FAU and the optical interface of one or more photonic ports of PIC 5013.

The passive portion 603P of PIC 5013, which is not actively powered electrically, may include optical waveguides or fibers supporting the one or more photonic ports. The passive portion 603P is thus optically provided with L-band light capable of carrying information load between EICs 5041, 5042, 5043, and neighboring EIC-PIC packages when the L-band light is modulated at, for example, active portion 603A hosting one or more light modulators, or one or more light detectors (e.g., photodiodes).

Figures 1, 7:
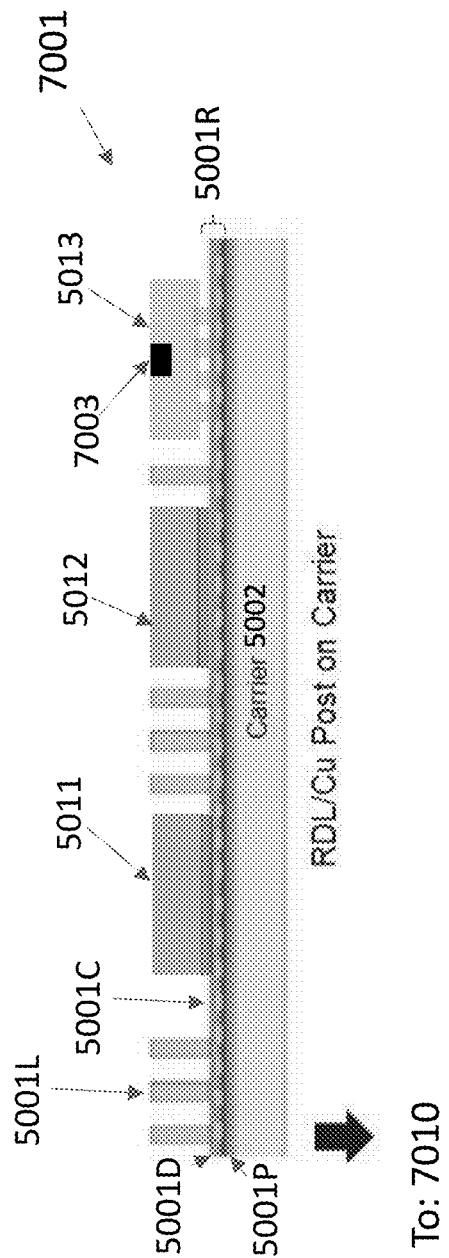
Figures 3, 7:
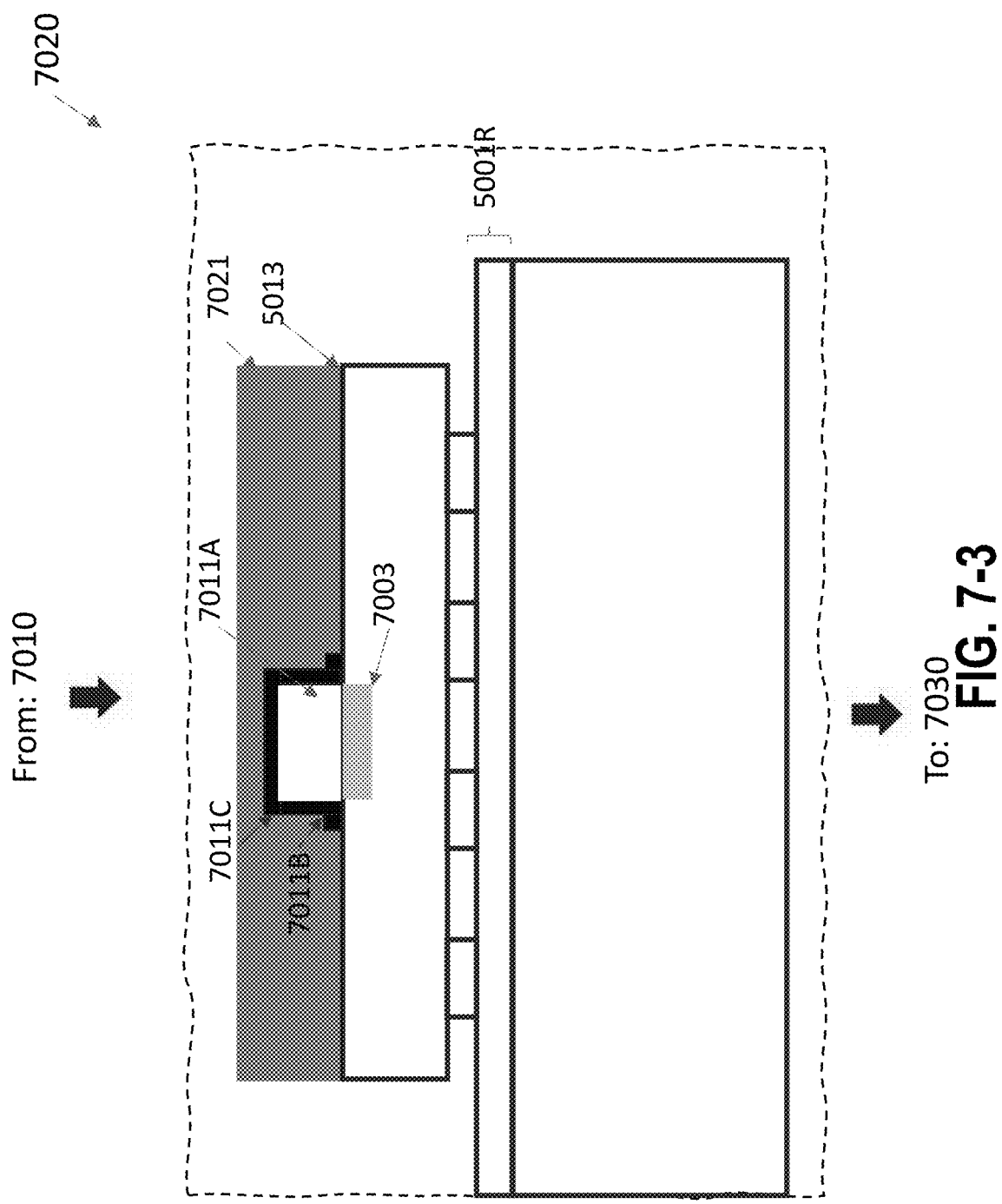
Figures 6, 7:
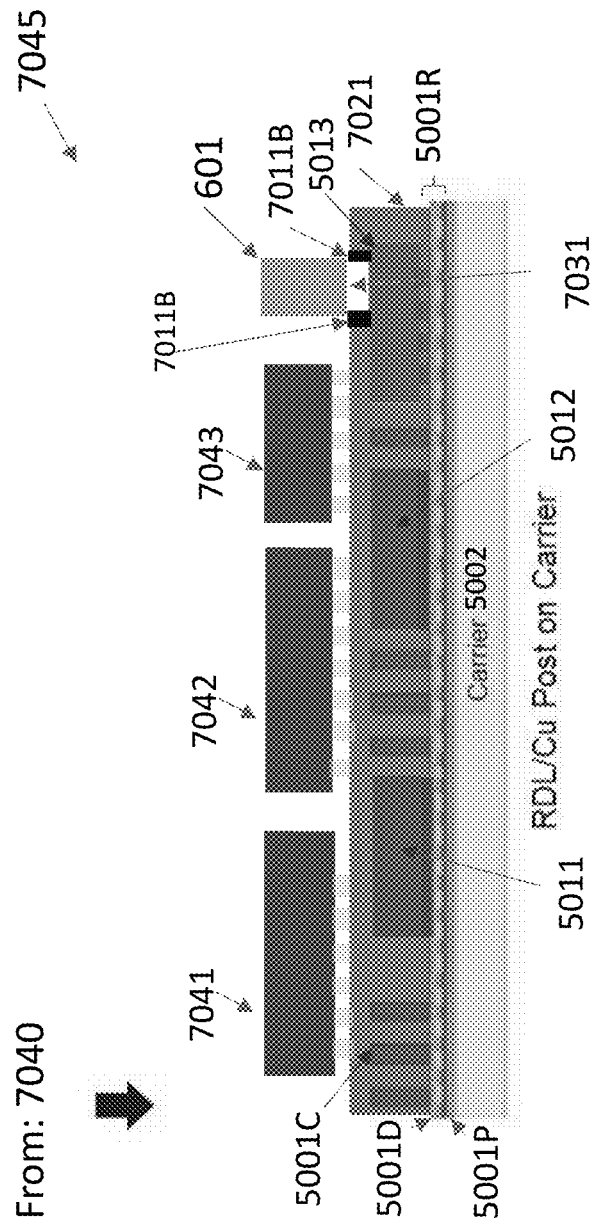

FIG. 7-1 to FIG. 7-6 illustrate another example process 7000 for packaging a EIC-PIC stack on a semiconductor substrate, e.g., as depicted in various examples shown above in FIGS. 1-1 to 4. Similar to the example illustrated in FIGS. 5-1 to 5-6, example process 700 can also provide a path for coupling the optical carrier signal, e.g., C-band or L-band laser light, from outside a package to the PIC of the package, thereby addressing the technical challenging of feeding the optical carrier signal to the PIC of the EIC-PIC stack.

FIG. 7-1 shows that at step 7001, which is similar to step 5001 of FIG. 5-1, a redistribution layer (RDL) 5001R and copper (Cu) pillars 5001C, shown as posts, are grown on carrier 5002. As illustrated, RDL 5001R may include dielectric layer 5001D and passivation layer 5001P. Copper pads 5001C are embedded RDL 500R for connecting the RDL to the underlying substrate. Copper studs 5000L are disposed for connecting to one or more EICs in the EIC-PIC stack. Carrier 5002 can be a glass carrier.

FIG. 7-2 shows that at step 7010, semiconductor dies 5011, 5012, and 5013 are positioned on RDL 5001R and carrier 5002. Similar to step 5010 of FIG. 5-2, RDL5001R is temporarily bonded to a glass carrier, which can be later peeled off using laser irradiation to remove the temporary bond. Each of dies 5011, 5012, and 5013 can be formed using die singulation. Dies 5011, 5012, and 5013 are examples of bridge dies embedded in the package so that the dies can bridge, for example, intra-chip data communication between various components to be positioned above the dies in the package.

FIG. 7-2 additionally provides an enlarged view of cap 7011. Here, the term "cap" is used interchangeably with "hat" or "lid." As illustrated, cap 7011 includes crown 7011C and brim 7011B. Crown 7011C defines a cavity 7011A that provides an open space over the ports 7003. Brim 7011B surrounds the base perimeter of crown 7011 so that cap 7011 sits on PIC 5013 with cavity 7011A over a passive portion of the PIC 5013 that includes the ports.

Cap 7011 is made of a molding material, e.g., which can be identical to the packaging material used in layer 5021, as depicted in FIG. 5-3, or can be different. Cap 7011 can be affixed to the surface of the underlying PIC 5013 using a suitable adhesive including, for example, epoxy adhesive, polyimide, or bonding adhesive. When positioning cap 7011 over PIC 5013, the alignment between hat 7011 and the underlying PIC 5013 can be based on fiduciary markers, which can be located on PIC 5013 or glass carrier 5002. In some examples, a fiduciary marker or markers can be formed in the surface of the PIC 5013 to ensure alignment of the cap 7011 with the photonic ports 7003. For example, a trench can be etched in the surface of the PIC 5013 shaped to match the brim 7011B, facilitating easy and accurate of alignment of the cap 7011 during the process.

FIG. 7-3 shows that at step 7020, a packaging material is applied to the top side of the assembly from step 7010 such that PIC 5013, along with bridge dies 5011 and 5012, are encased in layer 7021. The packaging material can include epoxy molding compounds (EMC), also known as epoxy resins or duroplast. In some cases, the layer (7021) of packaging material can be about 100 μm in thickness. In some cases, the cavity can have a thickness of about 50 μm or less, a lateral dimension of about 3 mm in width, and about 40 mm in length.

Thereafter, at step 7030 shown in FIG. 7-4, the packaging material is polished using, for example, a chemical mechanical polishing (CMP) process, which can trim down (or chip off) cap 7011 to remove a portion of the molding material and remove a top portion of the crown so that cavity 7031 is exposed to provide an opening over one or more photonic ports 7003 embedded in a passive portion of PIC 5013. Through this cavity 7031, a clear and unobstructed optical pathway can be provided using a curable material. For example, the curable material can fill cavity 7031 so that the photonic ports 7003, e.g., input and output photonic ports, for the active photonic component on PIC 5013 can be optically coupled to a fiber array unit (FAU) once the curable material is cured to become a solid and optically transparent material with optical refractive index substantially matched to that of the FAU or the optical transmission medium of the passive photonic component. Like cavity 5031 in FIG. 5-4, cavity 7031 may be filled with UV curable epoxy and can be 15, 20, or 30 μm in thickness, and between about 3 mm in width and 40 mm in length.

A step 7040 shown in FIG. 7-5, FAU 601 is provided atop cavity 7031 filled with optically transparent material with matching optical refractive index. FAU 601 can be a fiber bundle including, for example, 42 channels, and can be coupled to photonic ports of PIC 302 through grating coupler (GC), as illustrated in FIGS. 2-1 and 2-2. The grating coupler can be mounted on the photonic ports 7003 of the PIC 5013. The grating coupler can also be mounted on a port of the FAU 601. Additionally, or alternatively, the FAU 601 can also be coupled to the photonic ports 7003 through an edge coupler, as described above with reference to FIG. 1-4.

At step 7045 illustrated in FIG. 7-6, a high-bandwidth memory (HBM) 7041, a processor 7042, and an EIC 7043 are attached to the top side of the assembly resulting from step 7040, for example, by copper pillars using mechanical pressing. Implementations are not limited to the exact order of arrangement or specific number of memory/processor/EIC, as shown in FIG. 7-6. Here, EIC 7043 is stacked over the PIC being coupled to the FAU 601. Bridge dies 5011 and 5012 operate electric bridges for HBM 7041 and processor 7042. Moreover, EIC 7043 operates as a bridge between the PIC and HBM 7041 and processor 7042. As noted above with reference to FIG. 5-5, HBM 7041, processor 7042, and EIC 7043 may each have a local clock while the assembly operates by mesochronous clocking. Thereafter, carrier 5002 may be peeled off, for example, using laser irradiation. The assembly is then bonded to a substrate, such as a printed circuit board (PCB), for example, a high-density interconnect (HDI) PCB. The bonding to the substrate can be formed using a molded interposer package (MIP) process, as illustrated above in reference to FIG. 5-6.

Significantly, the process described in connection with FIGS. 7-1 through 7-6 can be repeated to allow for vertical stacking of additional layers (e.g., EIC layers) while preserving the vertical optical path to ports in PIC 5013. At step 7050 illustrated in FIG. 7-7, cap 7051 can be mounted atop cavity 7031 already formed. As illustrated, brim 7051B is placed on top of layer 7021 so that crown 7051C covers the opening to cavity 7031. Similar to steps 7-1 to 7-4, cap 7051 is made of a molding material.

Figures 7, 8:
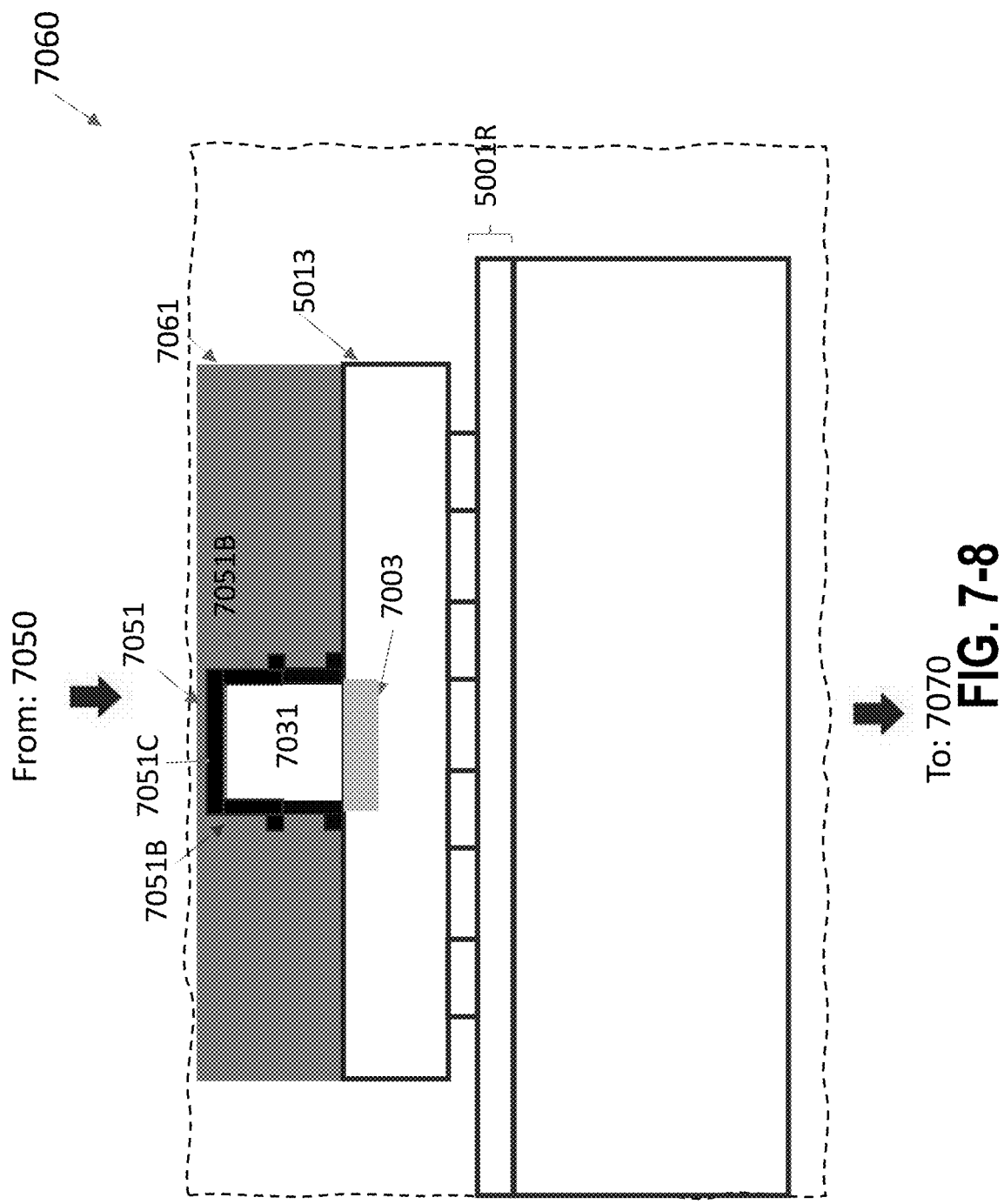

At step 7060 illustrated in FIG. 7-8, a layer (7061) of packaging material is deposited atop layer 7021 to encase cap 7051 and bury the underlying structures including PIC 5013 with the photonic ports 7003 embedded in a passive portion of PIC 5013. The packaging material can be identical to the molding material of cap 7051, as discussed above with reference to FIG. 7-3.

Figures 7, 8, 9:
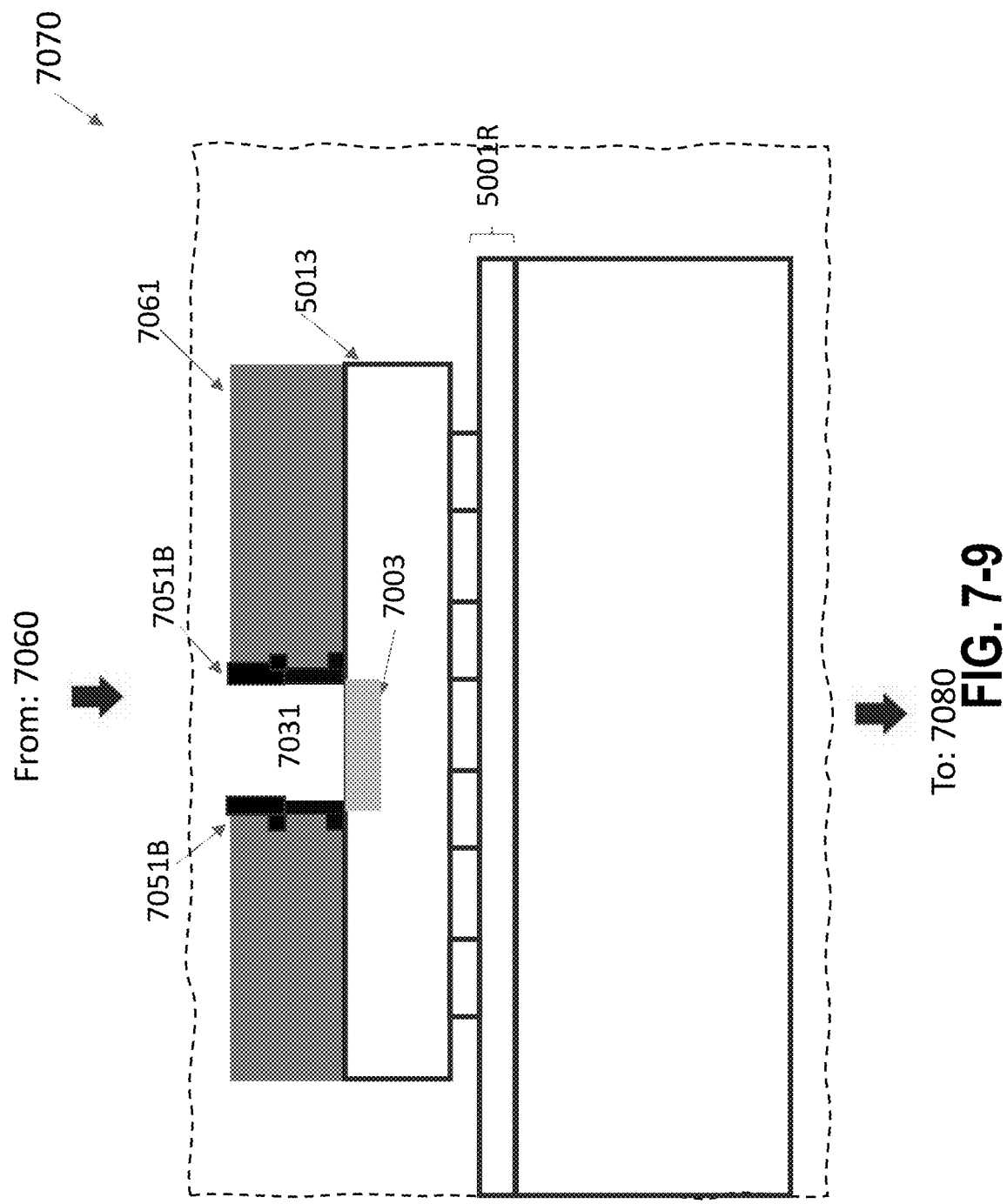
Figures 7, 8, 9, 10:
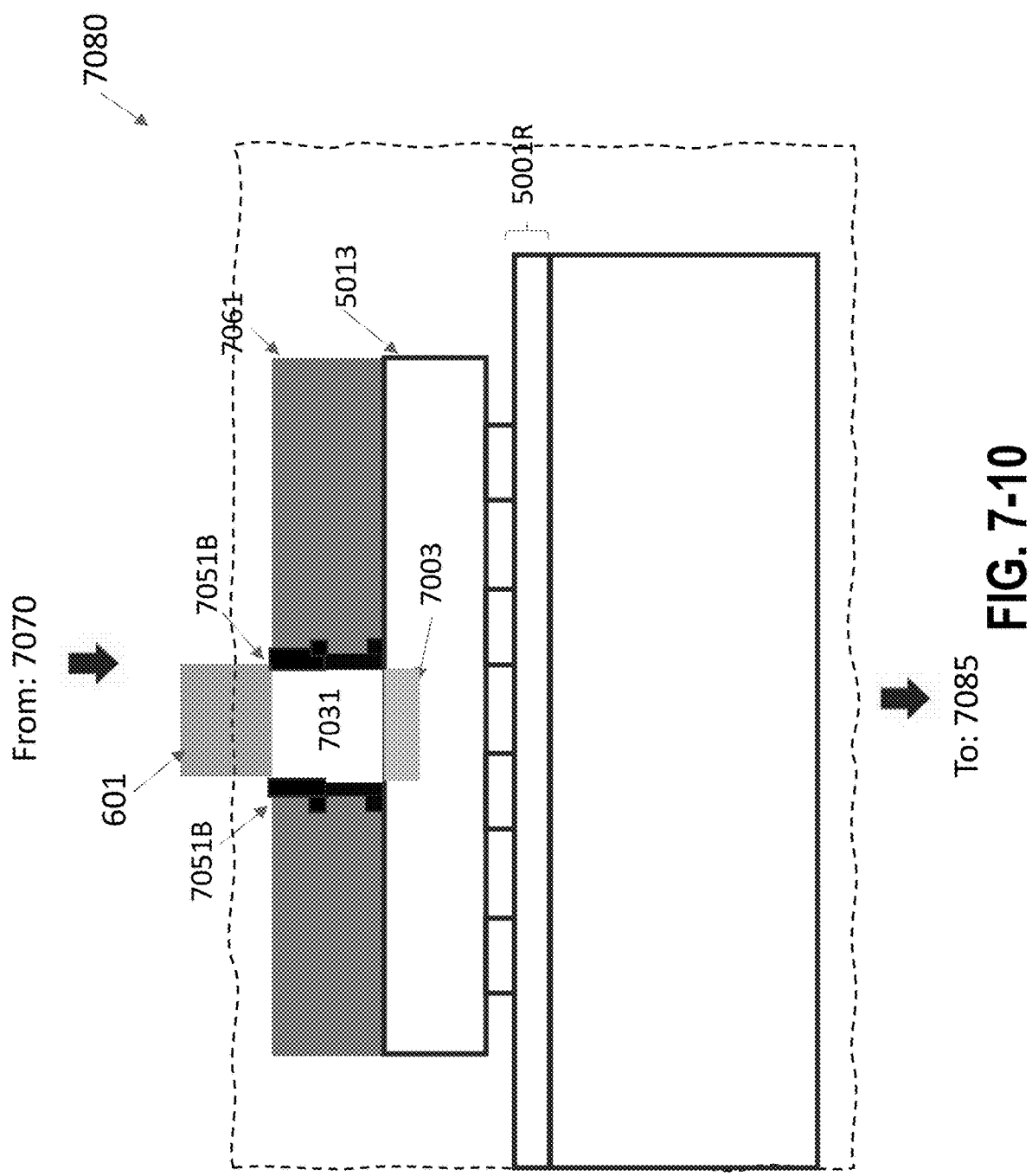
Figures 7, 8, 9, 10, 11:
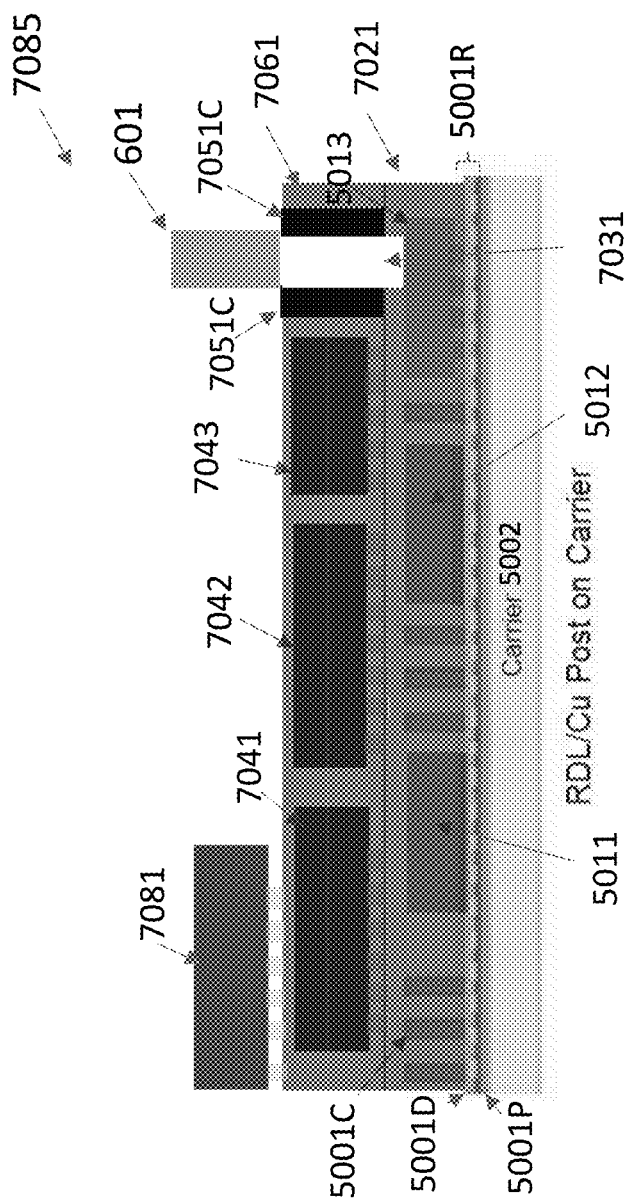
Figure 8:
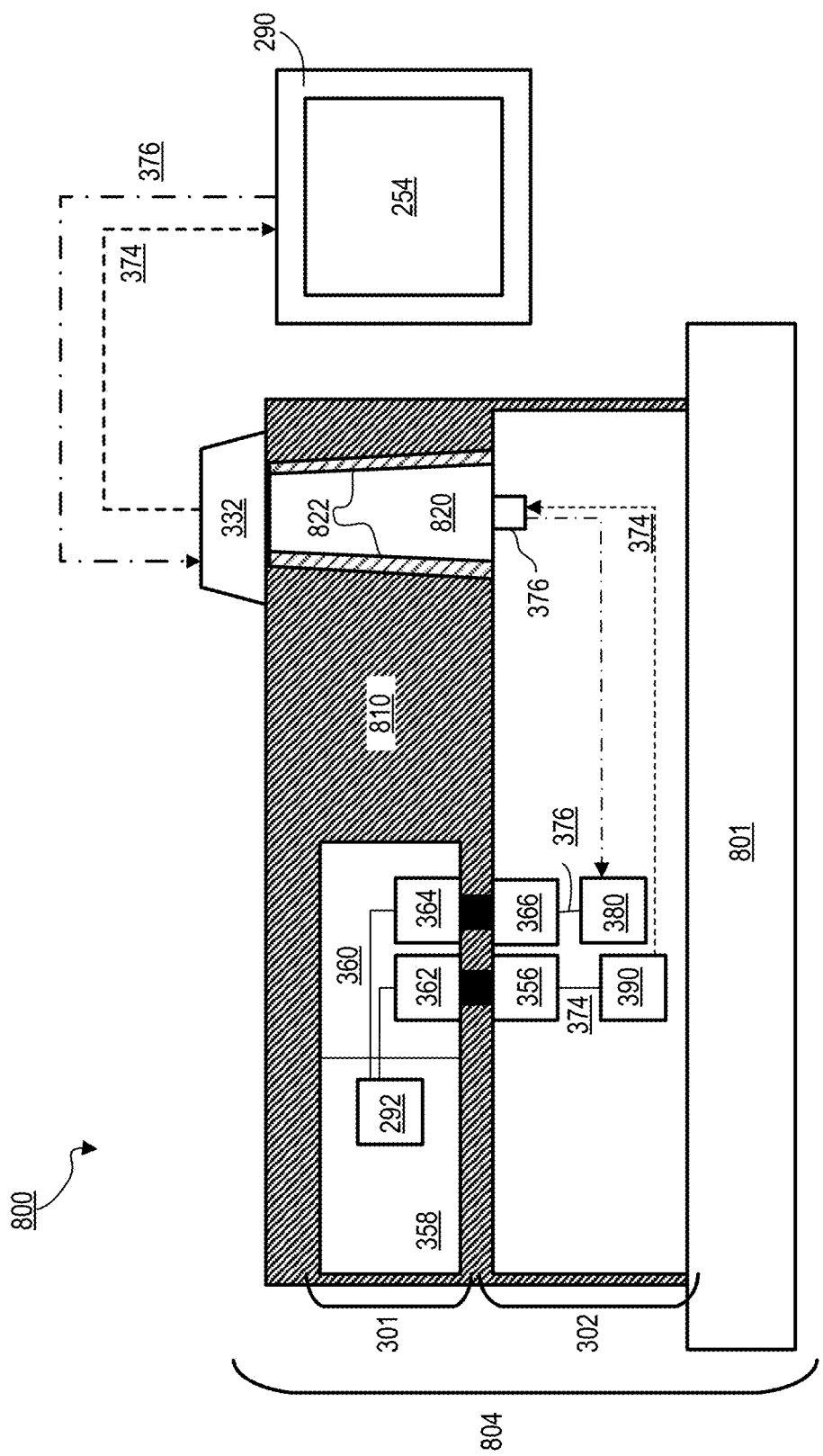
Figure 9:
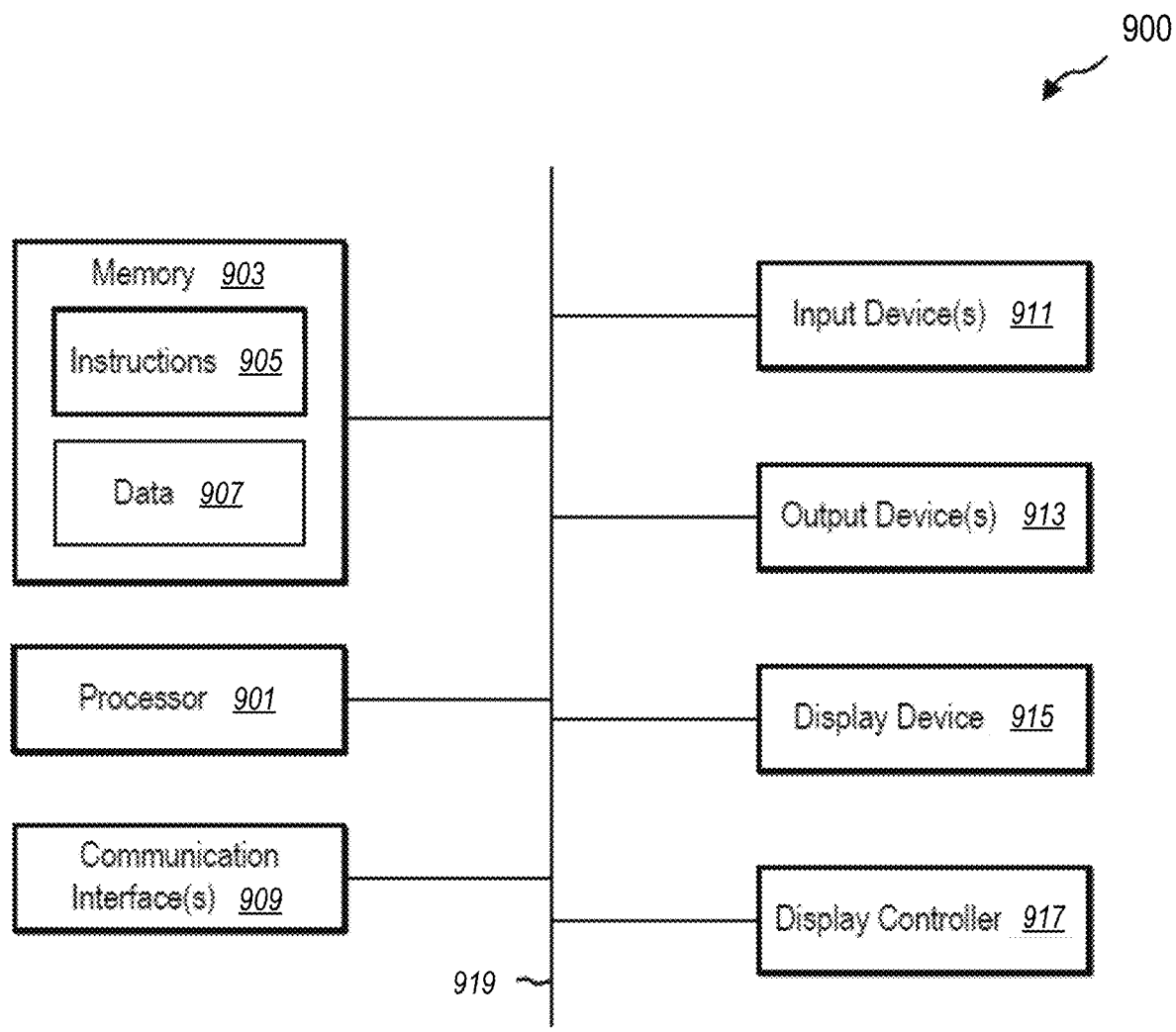

At step 7070 illustrated in FIG. 7-9, after polishing the layer 7061 using a CMP process, a portion of the packaging material is removed, along with a top portion of crown 7051C such that an opening is exposed that opens to existing cavity 7031, thus providing an unobstructed optical pathway to the photonic ports 7003 embedded in a passive portion of PIC 5013.

At step 7080 illustrated in FIG. 7-10, the opening can be filled with epoxy (e.g., UV curable epoxy) that is optically transparent with an optical index substantially matched to, for example, the optical transmission medium on PIC 5031 or FAU 601. As illustrated, FAU 601 can be provided atop the opening to cavity 7031.

At step 7085 illustrated in FIG. 7-11, a second layer of EIC components such as EIC 7081 can be developed on layer 7061. Additional layers of EIC components can be further stacked upward by following steps 7030, 7040, and 7050 iteratively while retaining optical access to the photonic ports 7003 embedded in a passive portion of PIC 5013.

While cap 7011 provides a space with a rectangular cross-section as depicted above, more generally, implementations are not limited to these example shapes and forms. Generally, caps having any shape suitable for providing a desired void footprint and depth while withstanding the packaging process can be sued. For example, caps with a vertical cross-section having non-rectangular polyhedron shapes can be used.

An example of such a cap is shown in FIG. 7-12. Here, a cap 7012 (shown in vertical cross section), provides a trapezoidal cavity 7012A. Furthermore, the cavity 7012A is provided by sidewalls 7012C with increasing thickness closer to the bottom (i.e., the side that contacts the PIC) and the brim does not extend beyond the sidewalls.

The cap's cross-section in the plane of the PIC (i.e., the footprint) can also vary. Generally, the footprint of the brim is shaped so that the cavity provides sufficient access to the photonic ports and the brim adequately supports the cap when affixed to the surface of the PIC. FIGS. 7-13 through 7-16 show examples of brim footprints. In some examples, the outer perimeter of the brim and the cavity have the same shape. For example, FIG. 7-13 shows a cap 7013 having a brim with a rectangular cavity perimeter 7013A and a rectangular outer perimeter 7013C. Another example is shown in FIG. 7-14 in which a cap 7104 includes a brim with a circular cavity perimeter 7013A and a circular outer perimeter 7013C.

In some examples, the brim and the cavity have differently shaped footprints. For example, FIG. 7-15 shows an example of a cap 7015 having a cavity having a circular perimeter 7015A and a brim with a square outer perimeter 7015C. FIG. 7-16 shows a cap 7016 having a cavity having a rectangular perimeter 7016A and a brim with a circular outer perimeter 7016C. The cavity can have a cylindrical cross-sectional shape, as revealed in the plan view from the top in FIG. 7-12 for cap 7014 (providing cavity 7014A) and cap 7015 (providing cavity 7015A). Other shaped perimeters are possible.

In some cases, the cap can have a footprint that matches the size and shape of the entire PIC 5013 with the crown positioned over the photonic ports. For example, the cap can formed from a block of material having a constant thickness that includes a blind hole in a surface at the location of photonic ports that precisely defines the cavity. In other words, a cap can be prefabricated to cover the entire PIC with a void that defines the desired cavity. Similarly, a cap can cover the full features on glass carrier 5002 including PIC 5013 and bridge dies 5011 and 5012, with the void at the corresponding location for the passive portion of PIC 5013.

In general, any of the circuit packages described above can be packaged using the techniques described herein. For example, referring to FIG. 8, a circuit package 800 can be formed by encapsulating the circuit package 200 shown in FIG. 2-2 using the techniques described above with reference to FIGS. 7-1 to 7-15. As described previously, circuit package 800 implements a bidirectional photonic channel between a compute node 804 and the additional compute node 254 located on the additional circuit package 290, such as a memory node on a memory circuit package. Compute node 804 has the same architecture as compute note 304 described previously, except that the PIC and EIC are mounted on a PCB 801 and encapsulated by a layer 810 of a packaging compound.

The EIC overlaps the top surface of the PIC, with components of the EIC being in close proximity to components of the PIC. For example, modulator 356 can be located 2 mm or less from driver 362 (e.g., 1 mm or less, 0.5 mm or less, 0.25 mm or less, such as 0.1 mm or more). Positioning a modulator in close proximity to its corresponding driver and/or positioning a photodetector close to its corresponding TIA can allow for relatively short electrical signal lines between the passive element in the PIC and the active element in the EIC. In some cases, the lines can be sufficiently short that circuitry commonly used to reduce noise associated with longer signal lines can be omitted without unacceptable loss in fidelity of the electrical signals.

Optical access through the layer 810 to the grating coupler 354 at photonic ports on the top surface of the PIC 302 is provide by a cavity 820. The cavity 820 is bound by cap sidewalls 822, which result from the packaging process described above. The cavity 820 can be filled with an optically transparent medium. The cap sidewalls 822 can be formed from the same packaging compound as layer 810 or from a different material. The FAU 332 is attached to the circuit package 804 on the top surface of the layer 810 over the cavity 820.

The modulator 356 can be an EAM that is relatively thermally stable. In other words, the modulator 356 can operate reliably over a large range of temperatures (e.g., from room temperature to 80° C.). Accordingly, the modulators and/or photodetectors can be positioned in close proximity to active electronic elements in the EIC, e.g., each modulator can be positioned in close proximity to its corresponding modulator driver and/or each photodetector can be positioned in close proximity to its corresponding TIA. Here, close proximity means that the components in the PIC experience substantial thermal loading when the EIC is active and can experience significant changes in temperature (e.g., changes of 10° C. or more, 20° C. or more, 30° C. or more) when switching between active and inactive states).

In some cases, the EIC can include other integrated circuits that generate significant thermal loads in the same chip as the drivers and TIAs. For example, the EIC can include one or more application specific integrated circuit (ASIC) in the same chip, e.g., circuits for performing processing of machine learning models.

As a result of thermally stable components, the circuit packages described here, such as circuit package 804, can be relatively compact.

Computer System

FIG. 9 illustrates certain components that may be included within a computer system 800. One or more computer systems 900 may be used to implement the various devices, components, and systems described herein.

The computer system 900 includes a processor 901. The processor 901 may be a general-purpose single- or multi-chip microprocessor, e.g., an Advanced RISC (Reduced Instruction Set Computer) Machine (ARM), a special purpose microprocessor, e.g., a digital signal processor (DSP), a microcontroller, a programmable gate array, etc. The processor 901 may be referred to as a central processing unit (CPU). Although just a single processor 901 is shown in the computer system 900 of FIG. 9, in an alternative configuration, a combination of processors, e.g., an ARM and DSP, could be used.

The computer system 900 also includes memory 903 in electronic communication with the processor 901. The memory 903 may be any electronic component capable of storing electronic information. For example, the memory 903 may be embodied as random-access memory (RAM), read-only memory (ROM), magnetic disk storage media, optical storage media, flash memory devices in RAM, on-board memory included with the processor, erasable programmable read-only memory (EPROM), electrically erasable programmable read-only memory (EEPROM) memory, registers, and so forth, including combinations thereof.

Instructions 905 and data 907 are stored in the memory 903. The instructions 905 are executable by the processor 901 to implement some or all of the functionality disclosed herein. Executing the instructions 905 may involve the use of the data 907 that is stored in the memory 903. Any of the various examples of modules and components described herein may be implemented, partially or wholly, as instructions 905 stored in memory 903 and executed by the processor 901. Any of the various examples of data described herein may be among the data 907 that is stored in memory 903 and used during execution of the instructions 905 by the processor 901.

A computer system 900 may also include one or more communication interfaces 909 for communicating with other electronic devices. The one or more communication interfaces 909 may be based on wired communication technology, wireless communication technology, or both. Some examples of communication interfaces 909 include a Universal Serial Bus (USB), an Ethernet adapter, a wireless adapter that operates in accordance with an Institute of Electrical and Electronics Engineers (IEEE) 802.11 wireless communication protocol, a Bluetooth® wireless communication adapter, and an infrared (IR) communication port.

A computer system 900 may also include one or more input devices 911 and one or more output devices 913. Some examples of input devices 911 include a keyboard, mouse, microphone, remote control device, button, joystick, trackball, touchpad, and lightpen. Some examples of output devices 913 include a speaker and a printer. One specific type of output device that is typically included in a computer system 900 is a display device 915. Display devices 915 used with examples disclosed herein may utilize any suitable image projection technology, such as liquid crystal display (LCD), light-emitting diode (LED), gas plasma, electroluminescence, or the like. A display controller 917 may also be provided, for converting data 907 stored in the memory 903 into text, graphics, and/or moving images (as appropriate) shown on the display device 915.

The various components of the computer system 900 may be coupled together by one or more buses, which may include a power bus, a control signal bus, a status signal bus, a data bus, etc. For the sake of clarity, the various buses are illustrated in FIG. 9 as a bus system 919.

The techniques described herein may be implemented in hardware, software, firmware, or any combination thereof, unless specifically described as being implemented in a specific manner. Any features described as modules, components, or the like may also be implemented together in an integrated logic device or separately as discrete but interoperable logic devices. If implemented in software, the techniques may be realized at least in part by a non-transitory processor-readable storage medium comprising instructions that, when executed by at least one processor, perform one or more of the methods described herein. The instructions may be organized into routines, programs, objects, components, data structures, etc., which may perform particular tasks and/or implement particular data types, and which may be combined or distributed as desired in various examples.

Computer-readable media can be any available media that can be accessed by a general purpose or special purpose computer system. Computer-readable media that store computer-executable instructions are non-transitory computer-readable storage media, i.e., devices. Computer-readable media that carry computer-executable instructions are transmission media. Thus, by way of example, and not limitation, examples of the disclosure can comprise at least two distinctly different kinds of computer-readable media: non-transitory computer-readable storage media and transmission media.

Examples of the present disclosure may thus utilize a special purpose or general-purpose computing system including computer hardware, such as, for example, one or more processors and system memory. Examples within the scope of the present disclosure also include physical and other computer-readable media for carrying or storing computer-executable instructions and/or data structures, including applications, tables, data, libraries, or other modules used to execute particular functions or direct selection or execution of other modules. Such computer-readable media can be any available media that can be accessed by a general purpose or special purpose computer system. Computer-readable media that store computer-executable instructions (or software instructions) are physical storage media. Computer-readable media that carry computer-executable instructions are transmission media. Thus, by way of example, and not limitation, examples of the present disclosure can include at least two distinctly different kinds of computer-readable media, namely physical storage media or transmission media. Combinations of physical storage media and transmission media should also be included within the scope of computer-readable media.

Both physical storage media and transmission media may be used temporarily store or carry, software instructions in the form of computer readable program code that allows performance of examples of the present disclosure. Physical storage media may further be used to persistently or permanently store such software instructions. Examples of physical storage media include physical memory, e.g., RAM, ROM, EPROM, EEPROM, etc., optical disk storage, e.g., CD, DVD, HDDVD, Blu-ray, etc., storage devices, e.g., magnetic disk storage, tape storage, diskette, etc., flash or other solid-state storage or memory, or any other non-transmission medium which can be used to store program code in the form of computer-executable instructions or data structures and which can be accessed by a general purpose or special purpose computer, whether such program code is stored as or in software, hardware, firmware, or combinations thereof.

A "network" or "communications network" may generally be defined as one or more data links that enable the transport of electronic data between computer systems and/or modules, engines, and/or other electronic devices. When information is transferred or provided over a communication network or another communications connection, either hardwired, wireless, or a combination of hardwired or wireless, to a computing device, the computing device properly views the connection as a transmission medium. Transmission media can include a communication network and/or data links, carrier waves, wireless signals, and the like, which can be used to carry desired program or template code means or instructions in the form of computer-executable instructions or data structures and which can be accessed by a general purpose or special purpose computer.

Further, upon reaching various computer system components, program code in the form of computer-executable instructions or data structures can be transferred automatically or manually from transmission media to physical storage media or vice versa. For example, computer-executable instructions or data structures received over a network or data link can be buffered in memory, e.g., RAM, within a network interface module (NIC), and then eventually transferred to computer system RAM and/or to less volatile physical storage media at a computer system. Thus, it should be understood that physical storage media can be included in computer system components that also or even primarily utilize transmission media.

INDUSTRIAL APPLICABILITY

As discussed herein in detail, the present disclosure includes a number of practical applications having features described herein that provide benefits and/or solve problems associated with providing a multi-node computing system with sufficient memory, processing, bandwidth, and energy efficiency constraints for effective operation of AI and/or ML models. Some example benefits are discussed herein in connection with various features and functionalities provided by the computing system as described. It will be appreciated that benefits explicitly discussed in connection with one or more examples described herein are provided by way of example and are not intended to be an exhaustive list of all possible benefits of the computing system.

For example, the various circuit packages described herein and connections thereof enable the construction of complex topologies of compute and memory nodes that can best serve a specific application. In a simple example, a set of photonic channels connect memory circuit packages with memory nodes, e.g., memory resources, to one or more compute circuit packages with compute nodes. The compute circuit packages and memory circuit packages can be connected and configured in any number of network topologies which may be facilitated through the use of one or more photonic channels include optical fibers. This may provide the benefit of relieving distance constraints between compute and/or memory nodes and, for example, the memory circuit packages can physically be placed arbitrarily far from the compute circuit packages, within the optical budget of the photonic channels.

The various network topologies may provide significant speed and energy savings. For example, photonic transport of data is typically more efficient than an equivalent high-bandwidth electrical interconnect in an EIC of the circuit package itself. By implementing one or more photonic channels, the electrical cost of transmitting data may be significantly reduced. Additionally, photonic channels are typically much faster than electrical interconnects, and thus the use of photonic channels permits the grouping and topology configurations of memory and compute circuit packages that best serve the bandwidth and connectivity needs of a given application. Indeed, the architectural split of memory and compute networks allows each to be optimized for the magnitude of data, traffic patterns, and bandwidth of each network applications. A further added benefit is that of being able to control the power density of the system by spacing memory and compute circuit packages to optimize cooling efficiency, as the distances and arrangements are not dictated by electrical interfaces.

One or more specific examples of innovative technologies are described herein. Additionally, in an effort to provide a concise description of these examples, not all features of an actual example may be described in the specification. It should be appreciated that in the development of any such actual implementation, as in any engineering or design project, numerous example-specific decisions will be made to achieve the developers' specific goals, such as compliance with system-related and business-related constraints, which may vary from one example to another. Moreover, it should be appreciated that such a development effort might be complex and time consuming, but would nevertheless be a routine undertaking of design, fabrication, and manufacture for those of ordinary skill having the benefit of this disclosure.

Numbers, percentages, ratios, or other values stated herein are intended to include that value, and also other values that are "about" or "approximately" the stated value, as would be appreciated by one of ordinary skill in the art, encompassed by examples of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The following are non-limiting examples of innovative embodiments of the present disclosure.

A1. A method for embedding a photonic integrated circuit (PIC) in a package comprising the PIC and at least one electronic integrated circuit (EIC), the PIC comprising an active portion which consumes electrical power when the PIC is activated and a passive portion comprising an optical transmission medium configured to propagate an optical signal to or from the active portion, the method comprising:
  masking a portion of a surface of the PIC with a masking material, the portion corresponding to one or more photonic ports in the passive portion of the PIC;
  depositing a layer of a molding material to at least partially encase the PIC including the masking material; and
  removing a portion of the layer of the molding material sufficient to expose the masking material.

A2. The method of A1, further comprising:
  removing the masking material from the surface of the PIC to provide a cavity in the molding material, the cavity exposing the one or more photonic ports; and
  filling the cavity with an optically transparent medium such that the optical signal can be received or transmitted through the cavity.

A3. The method of A2, further comprising disposing the PIC on a glass carrier.

A4. The method of A3, further comprising:
  peeling off the glass carrier; and
  after peeling off the glass carrier, mounting the package on a printed circuit board (PCB).

A5. The method of A2, wherein filling the cavity comprises:
  introducing a volume of a curable material into the cavity such that the cavity is at least partially filled; and
  curing the curable material in the cavity to provide an optically transparent window in the cavity, wherein the curable material is an ultraviolet curable epoxy.

A6. The method of A5, further comprising:
  aligning an optical interface with the passive portion of the PIC such that the optical signal can be received from or transmitted to the optical interface through the optically transparent window in the cavity, wherein the optical interface is a fiber attach unit (FAU).

A7. The method of A6, further comprising:
  disposing a coupler between the optical interface and cavity to couple the optical signal from the optical interface to one of the photonic ports, wherein the coupler comprises at least one of a grating coupler or an edge coupler.

A8. The method of A6, further comprising:
  coupling the optical interface to at least one of a light engine or an optical interface on another package.

A9. The method of A1, wherein the layer of molding material is 100 μm or less in thickness.

A10. The method of A1, further comprising:
  providing, in the package, a high-bandwidth memory (HBM), and a processor, wherein the at least one EIC bridges the PIC to the HBM and the processor.

A11. A method for embedding a photonic integrated circuit (PIC) in a package comprising the PIC and at least one electronic integrated circuit (EIC), the PIC comprising an active portion which consumes electrical power when the PIC is activated and a passive portion comprising an optical transmission medium configured to allow an optical signal to propagate to or from the active portion, the method comprising:
  depositing a first layer of a curable material on a portion of a surface of the PIC, the portion of the surface corresponding to one or more photonic ports in the passive portion of the PIC;
  curing the curable material to provide a layer of a solid and transparent material adjacent to the portion of the surface of the PIC;
  depositing a layer of molding material to at least partially encase the PIC including the layer of solid and transparent material; and removing a portion of the layer of molding material sufficient to expose the solid and transparent material.

A12. The method of A11, wherein the curable material is an ultraviolet (UV) curable epoxy.

A13. The method of A11, wherein removing the portion of the layer comprises griding or polishing the layer of molding material to provide a substantially planar surface of the molding material and the solid and transparent material, and
wherein the layer of molding material is less than 100 μm in thickness while providing sufficient rigidity for packaging the PIC along with the at least one EIC.

A14. The method of A11, further comprising:
introducing a second layer of the curable material between the solid and transparent material and an optical interface such that the optical signal can be received from or transmitted to the optical interface from the photonic ports, wherein the optical interface is a fiber attach unit (FAU).

A15. The method of A14, further comprising:
disposing the PIC on a glass carrier.

A16. The method of A15, further comprising:
removing the glass carrier from the package; and
after removing the glass carrier, mounting the package on a printed circuit board (PCB).

A17. The method of A14, further comprising:
curing the second layer of curable material.

A18. The method of A17, further comprising:
aligning the optical interface with the passive portion of the PIC such that, once the second layer of curable material is cured, the optical signal can be received from or transmitted to the optical interface through the layer of solid and transparent material.

A19. The method of A17, further comprising:
disposing a coupler between the optical interface and cavity such that the optical signal from the optical interface to one of the photonic ports, wherein the coupler comprises at least one of a grating coupler or an edge coupler, and
coupling the optical interface to at least one of a light engine or an optical interface on another package.

A20. The method of A11, further comprising:
providing, in the package, a high-bandwidth memory (HBM), and a processor, wherein the at least one EIC bridges the PIC to the HBM and the processor.

A21. A package comprising:
a photonic integrated circuit (PIC) disposed on a substrate and comprising a semiconductor die hosting an active portion and a passive portion mutually coupled, the active portion being configured to consume electrical power when activated, and the passive portion comprising an optical transmission medium configured to propagate an optical signal to or from the active portion of the PIC;
an electronic integrated circuit (EIC) electrically coupled to the active portion of the PIC and comprising components that electrically operate on the active portion of the PIC; and
a packaging compound at least partially encapsulating the PIC, the packaging compound defining a cavity on a side of the semiconductor die that is opposite from the substrate, the cavity being filled with an optically transparent medium such that the optical signal can be received from or transmitted to the passive portion of the PIC through the cavity.

A22. The package of A21, wherein the active portion comprises at least one of an optical modulator, or a photodetector.

A23. The package of A22, wherein the EIC comprises at least one of:
a driver coupled to the optical modulator on the PIC and configured to drive the optical modulator such that information contents are modulated on the optical signal, and
a transimpedance amplifier coupled to the photodetector and configured to operate on the photodetector such that modulated optical signals are converted to electrical signals.

A24. The package of A21, wherein the optical transmission medium comprises at least one of a waveguide or a fiber.

A25. The package of A21, wherein the optically transparent medium comprises ultraviolet (UV) curable epoxy, and
wherein the optically transparent medium is characterized by an optical refractive index substantially matched to that of the optical transmission medium.

A26. The package of A25, wherein the cavity is coupled to an optical interface comprising a fiber attach unit (FAU),
wherein the cavity has a thickness of about 50 μm or less, and
wherein the cavity has a lateral dimension of about 3 mm in width and about 40 mm in length.

A27. The package of A26, further comprising:
a coupler disposed between the optical interface and the optical transmission medium on the PIC, wherein the coupler comprises at least one of a grating coupler or an edge coupler.

A28. The package of any one of A26, wherein the optical interface is coupled to at least one of a light engine or an FAU on another package, and
wherein the optical interface houses more than one optical channel.

A29. The package of A21, wherein the substrate is a printed circuit board (PCB).

A30. The package of A21, further comprising:
a high-bandwidth memory (HBM), and
a processor,
wherein the EIC bridges the PIC to the HBM and the processor.

B1. A method for embedding a photonic integrated circuit (PIC) in a package comprising the PIC and at least one electronic integrated circuit (EIC), the PIC comprising an active portion which consumes electrical power when the PIC is activated and a passive portion comprising an optical transmission medium configured to propagate an optical signal to or from the active portion, the method comprising:
disposing a cap on a surface of the PIC to cover one or more photonic ports on the surface of the passive portion of the PIC, the cap comprising a crown forming an opening over the one or more photonic ports and a brim on the surface of the PIC;
depositing a layer of molding material to at least partially encase the PIC and the cap; and
polishing the layer of molding material to remove a portion of the molding material and remove a top portion of the crown to expose the one or more photonic ports through the opening over the photonic ports.

B2. The method of B1, further comprising:
fabricating the cap using a mold that defines the opening within the cap such that when the cap is disposed on the PIC, the opening is directly atop the one or more photonic ports.

B3. The method of B2, wherein the opening is shaped to have a larger lateral dimension towards an upper portion of the opening than a lower portion of the opening when the cap is disposed on the PIC.

B4. The method of B2, wherein disposing the cap on the PIC comprises:
aligning the cap with the PIC based on, at least in part, one or more fiduciary markers.

B5. The method of B1, wherein the layer of molding material is 100 μm or less in thickness.

B6. The method of B1, further comprising:
filling the opening with an optically transparent medium having an optical refractive index substantially matching that of the one or more photonic ports.

B7. The method of B6, wherein filling the opening comprises: introducing a volume of a curable material into the opening such that the opening is at least partially filled; and
curing the curable material in the opening to provide an optically transparent window in the opening such that the optical signal can be received or transmitted through the optically transparent window,
wherein the curable material is an ultraviolet (UV) curable epoxy having an optical refractive index substantially matching that of the one or more photonic ports.

B8. The method of B5, further comprising:
mounting a fiber attach unit (FAU) over the optically transparent window; and
optically coupling the FAU to the at least one or more photonic ports through at least one of: a grating coupler, or an edge coupler.

B9. The method of B1, further comprising:
disposing an additional cap comprising a crown forming an opening atop the opening over the one or more photonic ports; and
polishing the additional cap to remove a top portion of the crown atop the opening so that the opening is exposed.

B10. The method of B9, further comprising:
filling the opening of the crown of the additional cap with an optically transparent medium having an optical refractive index substantially matching that of the one or more photonic ports.

B11. The method of B1, further comprising:
disposing the PIC on a glass carrier.
peeling off the glass carrier; and
after peeling off the glass carrier, mounting the package on a printed circuit board (PCB).

B12. The method of B1, further comprising:
providing, in the package, a high-bandwidth memory (HBM), and a processor, wherein the at least one EIC bridges the PIC to the HBM and the processor.

B13. A package comprising:
a photonic integrated circuit (PIC) disposed on a substrate and comprising a semiconductor die having an active portion and a passive portion mutually coupled, the active portion being configured to consume electrical power when activated, and the passive portion comprising an optical transmission medium configured to propagate an optical signal to or from the active portion of the PIC;
a cavity formed on a side of the semiconductor die that is opposite from the substrate, the cavity being filled with an optically transparent medium with an optical refractive index substantially matching that of the optical transmission medium such that the optical signal can be received from or transmitted to the passive portion of the PIC through the cavity; and
a fiber attach unit (FAU) mounted on the cavity to couple the optical signal to or from outside the package.

B14. The package of B13, further comprising:
an electronic integrated circuit (EIC) electrically coupled to the active portion of the PIC and comprising components that electrically operate on the active portion of the PIC.

B15. The package of B14, further comprising:
a packaging compound at least partially encapsulating the PIC, the packaging compound defining the cavity.

B16. The package of B14, wherein the cavity has a thickness of about 50 μm or less, and wherein the cavity has a lateral dimension of about 3 mm in width and about 40 mm in length.

B17. The package of B14, wherein the active portion of the PIC comprises at least one of an optical modulator, or a photodetector,
wherein the EIC comprises at least one of:
a driver coupled to the optical modulator on the PIC and configured to drive the optical modulator such that information contents are modulated on the optical signal, and
a transimpedance amplifier coupled to the photodetector and configured to operate on the photodetector such that modulated optical signals are converted to electrical signals.

B18. The package of B14, wherein substrate is a printed circuit board (PCB).

B19. The package of B14, further comprising:
a high-bandwidth memory (HBM), and
a processor,
wherein the EIC bridges the PIC to the HBM and the processor.

B20. The package of B13, further comprising:
a coupler disposed between the FAU and the optical transmission medium on the PIC, wherein the coupler comprises at least one of a grating coupler or an edge coupler.

B21. The package of B13, wherein the optical transmission medium comprises at least one of a waveguide or a fiber,
wherein the optically transparent medium comprises ultraviolet (UV) curable epoxy having an optical refractive index substantially matched to that of the optical transmission medium.

B22. The package of B13, further comprising:
an additional cavity formed atop the cavity, the additional cavity being filled with the optically transparent medium such that the optical signal can be received or transmitted through the additional cavity and the cavity.

B23. A package comprising:
an electronic integrated circuit (EIC);
a photonic integrated circuit (PIC) electrically coupled to the EIC through one or more electrical connections, the PIC comprising a semiconductor die having an active portion electrically connected to the EIC and configured to consume electrical power when activated, and a passive portion comprising an optical transmission medium configured to propagate optical signals to or from the active portion of the PIC, the passive portion comprising one or more photonic ports at a surface of the PIC;
a layer of a packaging compound at least partially encapsulating the EIC and the PIC;
an optical path through the layer of packaging compound to the one or more photonic ports at the surface of the PIC; and
a fiber attach unit (FAU) attached to the package and arranged to couple optical signals to or from the PIC via the one or more photonic ports.

B24. The package of B23, wherein the active portion of the PIC comprises at least one of:
an optical modulator; and
a photodetector; and
the EIC comprises at least one of:
a driver electrically coupled to the optical modulator through the one or more electrical connections, and configured to drive the optical modulator to modulate an optical signal propagating through the optical transmission medium on the PIC, and
a transimpedance amplifier electrically coupled to the photodetector through the one or more electrical connections, and configured to convert modulated optical signals received at the photodetector to electrical signals.

B25. The package of B24, wherein the driver is positioned 2 mm or less from the optical modulator.

B26. The package of B23, wherein the EIC at least partially overlaps the surface of the PIC.

B27. The package of B26, wherein the optical path is located at a portion of the PIC non-overlapping with the EIC.

B28. The package of B23, further comprising a substrate supporting the PIC on an opposite side of the PIC from the EIC.

B29. The package of B23, further comprising:
a high-bandwidth memory (HBM), and
a processor,
wherein the EIC bridges the PIC to the HBM and the processor.

B30. The package of B23, wherein the optical path comprises a layer of an ultraviolet (UV) curable epoxy.

While this specification contains many specific implementation details, these should not be construed as limitations on the scope of what is being claimed, which is defined by the claims themselves, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a claimed combination can in some cases be excised from the combination, and the claim may be directed to a subcombination or variation of a subcombination.

What is claimed is:

1. A method for embedding a photonic integrated circuit (PIC) in a package comprising the PIC and at least one electronic integrated circuit (EIC), the PIC comprising an active portion which consumes electrical power when the PIC is activated and a passive portion comprising an optical transmission medium configured to propagate an optical signal to or from the active portion, the method comprising:
masking a portion of a surface of the PIC with a masking material, the portion corresponding to one or more photonic ports in the passive portion of the PIC;
depositing a layer of a molding material to at least partially encase the PIC including the masking material;
removing a portion of the layer of the molding material sufficient to expose the masking material;
removing the masking material from the surface of the PIC to provide a cavity in the molding material, the cavity exposing the one or more photonic ports;
filling the cavity with an optically transparent medium such that the optical signal can be received or transmitted through the cavity;
disposing the PIC on a glass carrier
peeling off the glass carrier; and
after peeling off the glass carrier, mounting the package on a printed circuit board (PCB).

2. The method of claim 1, wherein filling the cavity comprises:
introducing a volume of a curable material into the cavity such that the cavity is at least partially filled; and
curing the curable material in the cavity to provide an optically transparent window in the cavity, wherein the curable material is an ultraviolet curable epoxy.

3. The method of claim 2, further comprising:
aligning an optical interface with the passive portion of the PIC such that the optical signal can be received from or transmitted to the optical interface through the optically transparent window in the cavity, wherein the optical interface is a fiber attach unit (FAU);
disposing a coupler between the optical interface and cavity to couple the optical signal from the optical interface to one of the photonic ports, wherein the coupler comprises at least one of a grating coupler or an edge coupler; and
coupling the optical interface to at least one of a light engine or an optical interface on another package.

4. The method of claim 1, wherein the layer of molding material is 100 μm or less in thickness.

5. The method of claim 1, further comprising:
providing, in the package, a high-bandwidth memory (HBM), and a processor, wherein the at least one EIC bridges the PIC to the HBM and the processor.

* * * * *